United States Patent
Sandhu et al.

(10) Patent No.: US 7,667,258 B2
(45) Date of Patent: Feb. 23, 2010

(54) DOUBLE-SIDED CONTAINER CAPACITORS USING A SACRIFICIAL LAYER

(75) Inventors: Gurtej S. Sandhu, Boise, ID (US); Kevin R. Shea, Boise, ID (US); Chris W. Hill, Boise, ID (US); Kevin J. Torek, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 352 days.

(21) Appl. No.: 11/625,130

(22) Filed: Jan. 19, 2007

(65) Prior Publication Data

US 2007/0117335 A1 May 24, 2007

Related U.S. Application Data

(62) Division of application No. 11/021,639, filed on Dec. 22, 2004, now Pat. No. 7,329,576.

(60) Provisional application No. 60/607,365, filed on Sep. 2, 2004.

(51) Int. Cl.
  *H01L 27/108* (2006.01)
  *H01L 21/8242* (2006.01)

(52) U.S. Cl. .......... 257/309; 257/301; 257/305; 257/306; 257/E21.149; 257/E21.396; 257/E27.092; 257/E27.094; 257/E29.346; 438/243; 438/249; 438/386; 438/387; 438/392

(58) Field of Classification Search ............ 257/301, 257/303, 305, 309; 438/243, 249, 386, 392
See application file for complete search history.

(56) References Cited

U.S. PATENT DOCUMENTS

| | | | |
|---|---|---|---|
| 5,278,091 A | 1/1994 | Fazan et al. | |
| 5,354,705 A | 10/1994 | Mathews et al. | |
| 5,539,230 A * | 7/1996 | Cronin | 257/306 |
| 5,937,294 A | 8/1999 | Sandhu et al. | |
| 5,956,587 A | 9/1999 | Chen et al. | |
| 6,104,055 A * | 8/2000 | Watanabe | 257/309 |
| 6,180,450 B1 | 1/2001 | Dennison et al. | |
| 6,312,986 B1 * | 11/2001 | Hermes | 438/254 |
| 6,350,647 B2 | 2/2002 | Sakao | |
| 6,372,574 B1 | 4/2002 | Lane et al. | |
| 6,451,661 B1 | 9/2002 | DeBoer et al. | |
| 6,451,667 B1 | 9/2002 | Ning | |
| 6,458,652 B1 * | 10/2002 | Chen et al. | 438/253 |
| 6,507,064 B1 | 1/2003 | Tang et al. | |
| 6,524,912 B1 | 2/2003 | Yang et al. | |
| 6,569,689 B2 | 5/2003 | Marsh | |
| 6,596,641 B2 | 7/2003 | Jost et al. | |
| 6,635,547 B2 | 10/2003 | DeBoer et al. | |
| 6,667,209 B2 | 12/2003 | Won et al. | |
| 6,962,846 B2 | 11/2005 | Fishburn et al. | |

(Continued)

OTHER PUBLICATIONS

Jones, et al., Wet-Chemical Etching and Cleaning of Silicon, Virginia Semiconductor Inc., Fredericksburg, VA, Jan. 2003, pp. 1-11.

*Primary Examiner*—Dao H Nguyen
(74) *Attorney, Agent, or Firm*—Knobbe, Martens, Olson & Bear LLP

(57) ABSTRACT

Double-sided container capacitors are formed using sacrificial layers. A sacrificial layer is formed within a recess in a structural layer. A lower electrode is formed within the recess. The sacrificial layer is removed to create a space to allow access to the sides of the structural layer. The structural layer is removed, creating an isolated lower electrode. The lower electrode can be covered with a capacitor dielectric and upper electrode to form a double-sided container capacitor.

17 Claims, 28 Drawing Sheets

U.S. PATENT DOCUMENTS 7,312,120 B2 12/2007 Shea
2002/0168830 A1* 11/2002 DeBoer et al. ............. 438/396
2003/0001268 A1 1/2003 Oh
2005/0250339 A1 11/2005 Shea et al.

* cited by examiner

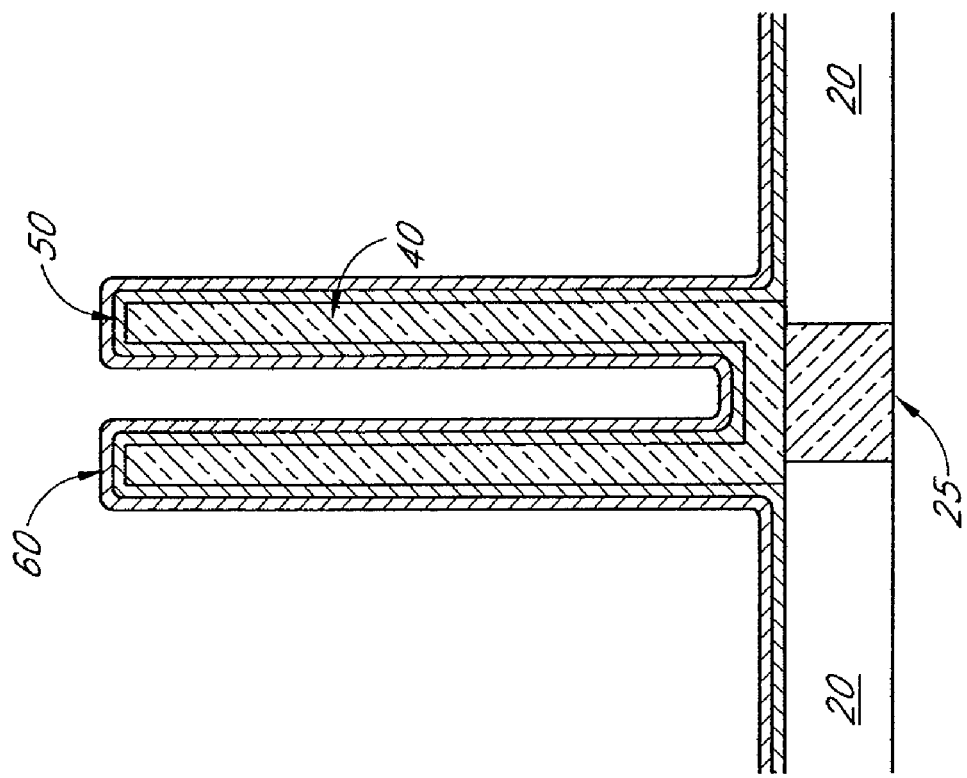

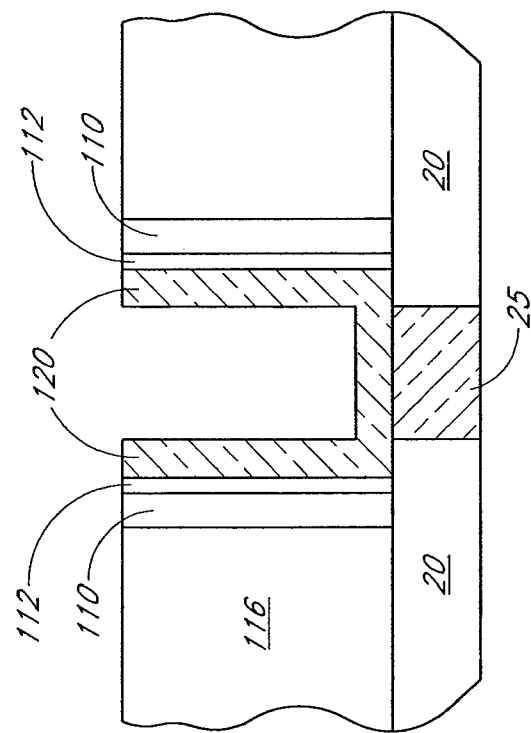
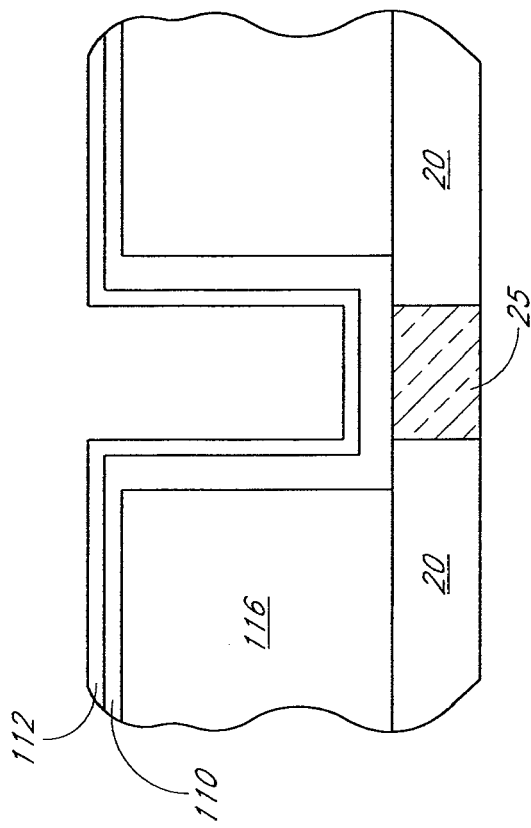

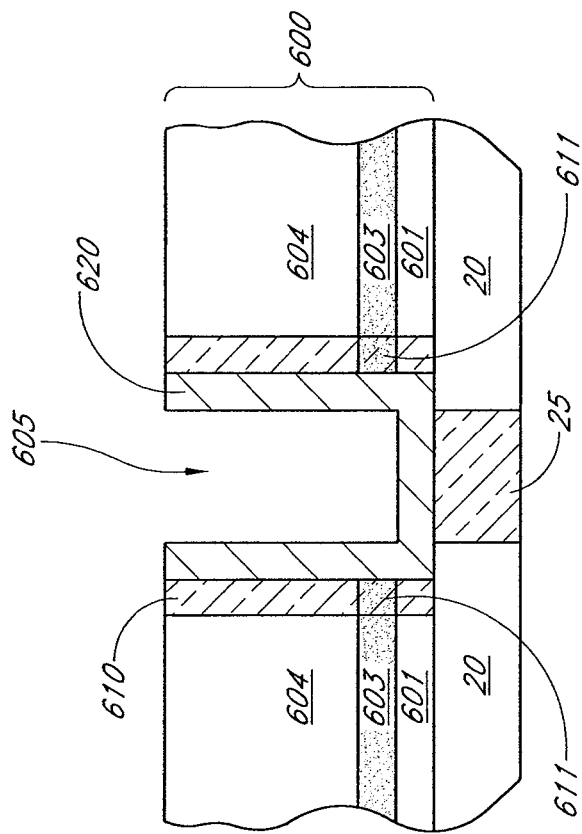
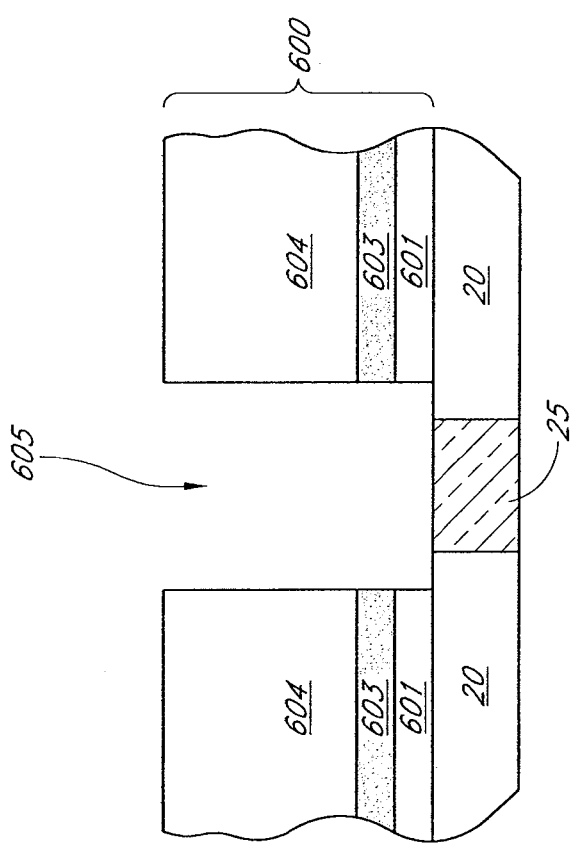

US 7,667,258 B2

DOUBLE-SIDED CONTAINER CAPACITORS USING A SACRIFICIAL LAYER

REFERENCE TO RELATED APPLICATIONS

This application is a divisional of U.S. patent application Ser. No. 11/021,639 filed Dec. 22, 2004, which claims priority to U.S. Provisional Application No. 60/607,365, filed Sep. 2, 2004, both of which are hereby incorporated by reference in their entireties.

FIELD OF THE INVENTION

The present invention relates to the field of integrated circuit fabrication, specifically to the fabrication of capacitors.

BACKGROUND OF THE INVENTION

Since the introduction of the digital computer, electronic storage devices have been a vital resource for the retention of data. Conventional semiconductor electronic storage devices typically incorporate capacitor and transistor structures, such as Dynamic Random Access Memory (DRAM), which temporarily store data based on the charged state of the capacitor structure. In general, this type of semiconductor Random Access Memory (RAM) often requires densely packed capacitor structures that are easily accessible for electrical interconnection. Many of these capacitor structures are fabricated with layers of material including semiconductor, dielectric, and metal.

Double-sided container capacitors are useful in DRAM circuits because they can be tightly packed. Additionally, overall capacitance of each capacitor is increased due to the high surface area including inside and outside surfaces of the container. Some of these structures have lower electrodes that are fabricated by first forming sacrificial spacers within a recess in a substrate, and then forming the lower electrode within the recess and lining annulus defined by the sacrificial layer on the sidewalls of the recess. An application describing this process was filed on Nov. 13, 2003, U.S. patent application Ser. No. 10/714,115. The selection of materials to be used for the lower electrode and the sacrificial layer can be important for cost and production purposes. Additionally, some sacrificial layers are not as effective as others in certain fabrication processes and when used with different materials. For this reason, additional methods of fabricating double-sided container capacitors are desirable.

SUMMARY OF THE INVENTION

In one aspect of the invention, a method is provided for forming an isolated lower electrode for a memory array. The method comprises depositing a sacrificial layer within a recess having a base and sidewalls in a structural layer material and depositing a protective liner over the sacrificial layer. The sacrificial layer and the protective liner are removed from the base of the recess and a lower electrode is deposited within the sacrificial layer and protective layer in the recess. The sacrificial layer is etched and the protective liner is removed. The method further comprises removing the structural layer from the memory array after etching the sacrificial layer.

In another aspect of the invention, a method of forming an electrically isolated capacitor electrode is disclosed. The method comprises creating a recess over a conductive contact plug in a structural layer and depositing a phosphosilicate glass (PSG) layer within the recess. The PSG layer is etched over the conductive contact plug and a container capacitor electrode is formed within the PSG layer in the recess. The method further comprises removing the PSG layer.

A method of forming a capacitor for a memory cell is disclosed in another aspect of the invention. The method comprises forming a recess within a structural layer and lining the sidewalls of the recess with a germanium oxide sacrificial layer. A lower electrode is deposited within the sacrificial layer and the sacrificial layer is removed from the sidewalls of the recess to form an access space. The structural layer is removed using an aqueous etchant in the access space. The method further comprises depositing a capacitor dielectric and an upper electrode conformally over the lower electrode.

In another aspect of the invention, a method of forming an isolated bottom capacitor electrode is disclosed. A recess is produced within a substantially undoped oxide structural layer and a doped oxide sacrificial liner is formed within the recess. A bottom electrode is deposited within the recess and the doped oxide sacrificial liner is etched selectively to the substantially undoped oxide structural layer. The substantially undoped oxide structural layer is removed.

A method of forming a capacitor for a memory cell is disclosed in another aspect of the invention. The method comprises forming a recess within a structural layer over an interlayer dielectric layer. A sacrificial layer is formed along the sidewalls of the recess and a lower electrode is formed within the sacrificial layer. A portion of the sacrificial layer is doped to form an etch stop. The sacrificial layer above the etch stop is removed. The structural layer is removed after the sacrificial layer is removed. A conformal capacitor dielectric is formed over the lower electrode and a conformal upper electrode is formed over the conformal capacitor dielectric.

In another aspect of the invention, a capacitor array for an integrated circuit is disclosed. The array comprises a plurality of conductive contact plugs within an interlayer dielectric layer and a plurality of container-shaped lower electrodes over each conductive plug. An insulating layer is positioned between the lower electrodes and an electrically unconnected metallic layer is over a portion of the insulating layer. A conformal capacitor dielectric that isolates the metallic layer extends over the lower electrodes. An upper electrode extends conformally over the conformal capacitor dielectric.

In another aspect of the invention, an integrated circuit including a capacitor is provided. The capacitor comprises a conductive contact plug within an underlayer and a container-shaped lower electrode over and electrically connected to the conductive contact plug. A polysilicon stub is next to a portion of the lower electrode on the substrate and a conformal capacitor dielectric extends over the lower electrode and the polysilicon stub. An upper electrode extends conformally over the conformal capacitor dielectric.

A method of fabricating a capacitor array for integrated circuits is disclosed in another aspect of the invention. The method comprises providing an insulating structural layer over a substrate and forming a plurality of recesses within the structural layer. A sacrificial layer is formed within each recess and an insulating protective liner is provided conformally over each sacrificial layer. A conductive plug is exposed in each recess and a first electrode is formed within each sacrificial layer. At least a portion of each sacrificial layer is removed before the structural layer is etched by exposure to an aqueous etchant solution. A conformal dielectric layer is provided over the first electrode and a top electrode is formed over the conformal dielectric layer.

In another aspect, a method of forming a memory cell is disclosed. The method comprises forming a borosilicate glass layer with a high boron concentration within a structural layer over an interlayer dielectric. A recess is formed within the structural layer, and the recess's walls are lined with a polysilicon sacrificial layer. The borosilicate glass layer produces a p-doped etch stop layer within the polysilicon sacrificial layer by diffusion of boron. A metallic first container capacitor electrode is formed within the polysilicon sacrificial layer. The polysilicon sacrificial layer is removed above the etch stop layer to form access spaces. The structural layer is recessed by allowing an etchant access to the structural layer from the access spaces. A conformal capacitor dielectric is deposited over the first container capacitor and a top electrode is formed over the conformal capacitor dielectric to form an isolated capacitor. The method further comprises providing a connection to a transistor.

A method of forming a capacitor in an integrated circuit is disclosed in another aspect of the invention. The method comprises forming a sacrificial layer in a recess in a structural layer. A lower electrode is formed within the sacrificial layer. A portion of the sacrificial layer is doped so that there is a doped portion and an undoped portion of the sacrificial layer. The method further comprises removing either the doped portion or the undoped portion.

BRIEF DESCRIPTION OF THE DRAWINGS

FIGS. 1A-1I are a series of schematic cross sections, illustrating one embodiment of a method for forming a capacitor structure in accordance with a preferred embodiment of the present invention.

FIGS. 2A-2D illustrate the formation of a lower electrode using phosphosilicate glass (PSG) as a sacrificial layer in accordance with a preferred embodiment.

FIGS. 6A-6G illustrate the formation of a lower electrode using a doped oxide collar with polysilicon as a sacrificial layer in accordance with a preferred embodiment.

DETAILED DESCRIPTION OF PREFERRED EMBODIMENTS

Figure 1A:
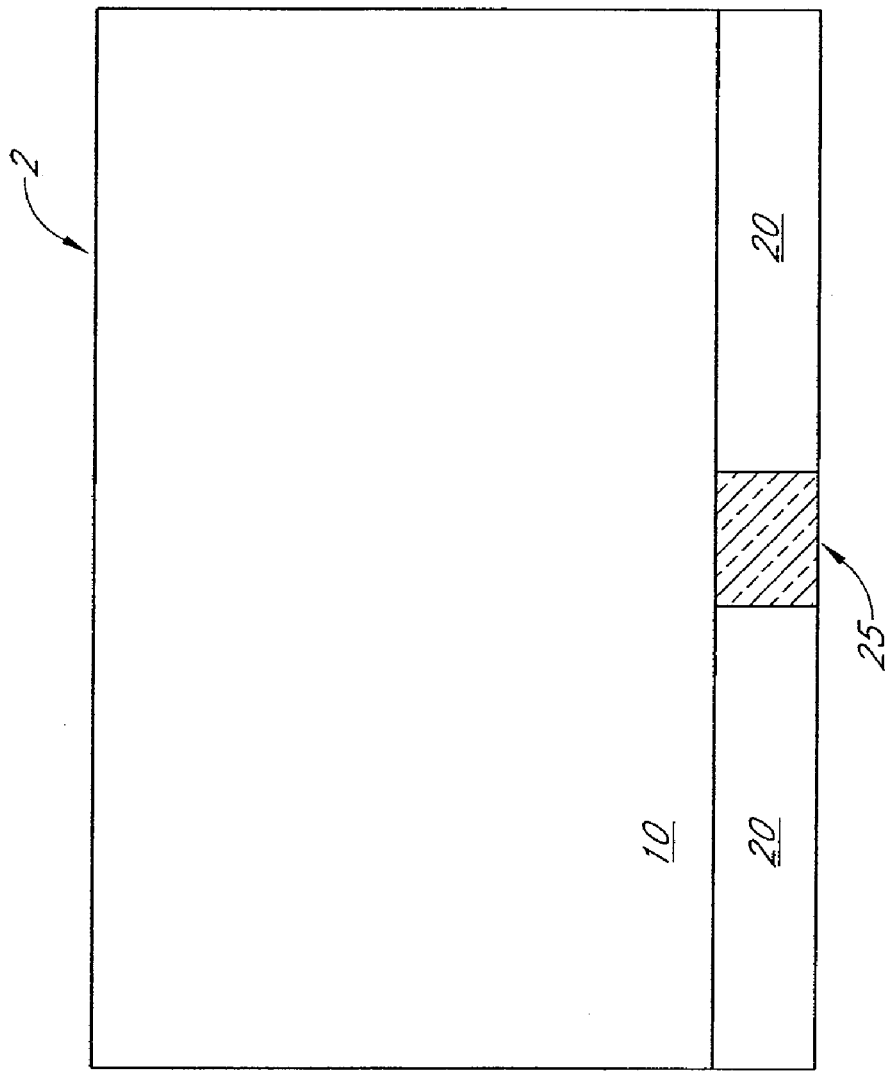

The formation of capacitors is critical to the functionality of dynamic random access memory (DRAM) cells. One form of a capacitor is a double-sided container capacitor, which uses a cup-shaped lower, or bottom, electrode with a conformal dielectric and a conformal upper, or top, electrode. One method of making these capacitors is to use a sacrificial layer along the sidewalls of a recess to form a space to remove the structural layer in which the capacitors are formed. Such use of sacrificial layers reduces the loss of oxide in the field outside of the array by accelerating the etching process of oxide materials within the array. A method of forming these sacrificial layers is described in U.S. patent application Ser. No. 10/714,115, which is incorporated by reference herein.

Formation of a Double-Sided Container Capacitor Using a Sacrificial Layer

FIGS. 1A-1I show one basic process flow for forming isolated capacitor structures using sacrificial layers. FIG. 1J is a flow chart of a preferred embodiment of a process flow for forming a double-sided container. With reference first to FIG. 1J, a recess is formed 210 in a structural layer. The recess is lined 220 with a sacrificial layer. A lower electrode, or first conductive layer, is formed 230 within the recess. In some embodiments, a punch-through etch is performed to expose a contact beneath the recess. The sacrificial layer is etched away 240, preferably causing as little damage as possible to surrounding layers. In some embodiments, the structural layer is removed before a conformal capacitor dielectric is deposited 250 over the surface of the first conductive layer. A second conductive layer is formed 260 over the conformal capacitor dielectric.

As pictured in FIG. 1A, a structural layer 10, which has an upper surface 2, can be made of several different materials. In one embodiment, the structural layer 10 comprises an insulating material, such as borophosphosilicate glass (BPSG), or other generally known materials, such as phosphosilicate glass (PSG), borosilicate glass (BSG) undoped silicon glass (USG), tetraethylorthosilicate (TEOS), silicon, polymer, etc. In some arrangements, the structural layer can even be conductive since it is ultimately removed from at least the memory array region. However, it is preferred that the structural layer 10 be insulating so that portions of it remain in peripheral regions outside the arrays. An interlayer dielectric (ILD) layer 20 surrounds an underlying conductive plug 25, which connects the capacitor to be formed thereover to another circuit component, such as a transistor, resistor, etc. The underlayer 20 insulates conductive elements to ensure that no short circuits are formed.

Figure 1B:
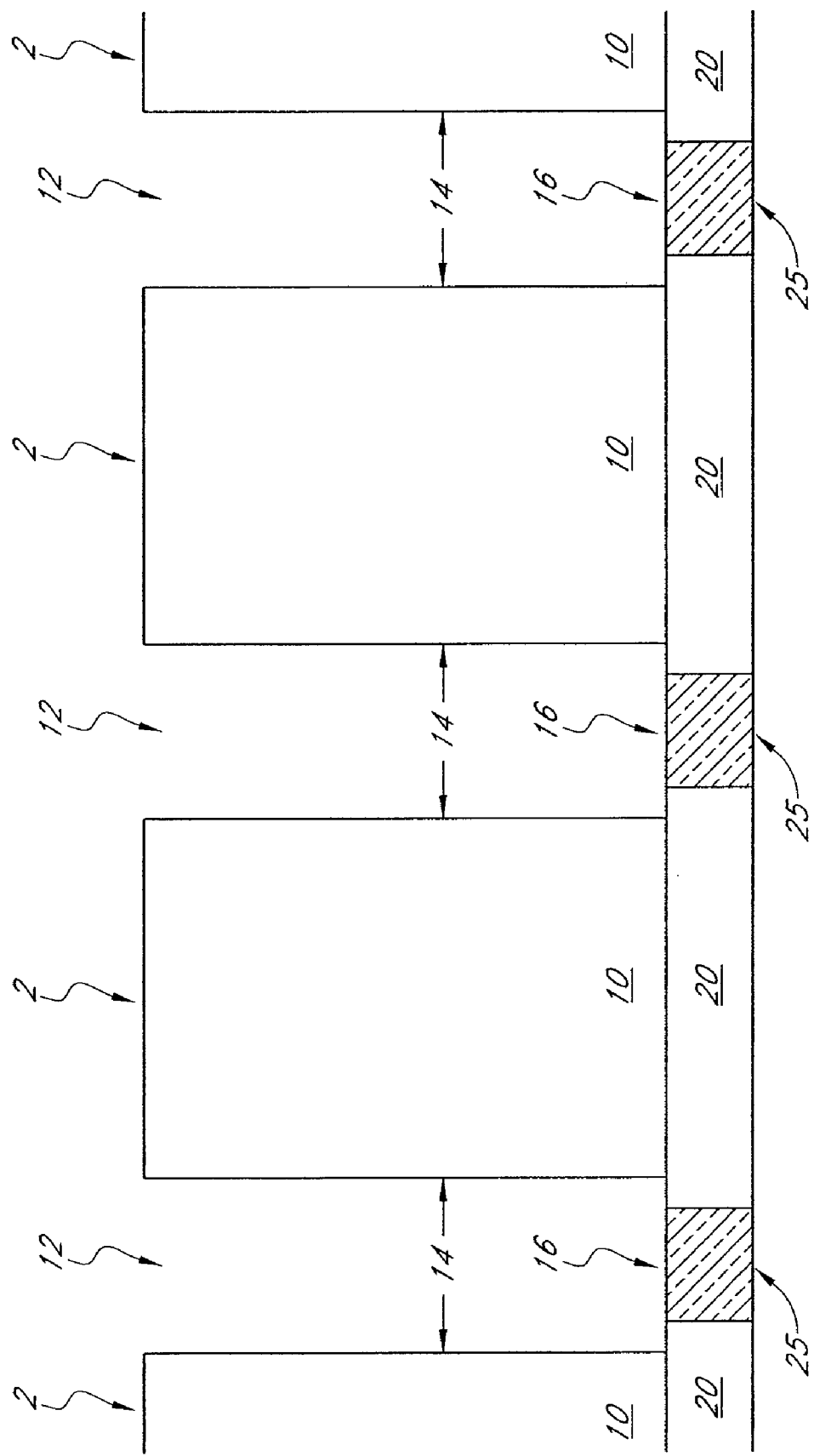

In FIG. 1B, several containers or recesses 12 have been formed in the structural layer 10. Preferably, the capacitors are being formed within a memory cell array. The recesses are preferably spaced apart from each other by between about 60 nm and 150 nm. The recesses 12 can be formed through generally known mask and etch techniques, preferably using an anisotropic etch method, such as reactive ion etching (RIE). Each recess 12 is preferably etched to a depth of between about 1600 Å and 2600 Å, more preferably between about 1800 Å and 2200 Å, vertically into the structural layer 10. Each recess 12 is preferably etched to expose one of the conductive plugs 25 and is defined by sidewalls 14 and a base 16. Preferably, each recess 12 will be approximately centered over one of the conductive plugs 25. The depth, shape and other properties of the recesses can be altered for different applications without departing from the scope of the present teachings.

Figure 1C:
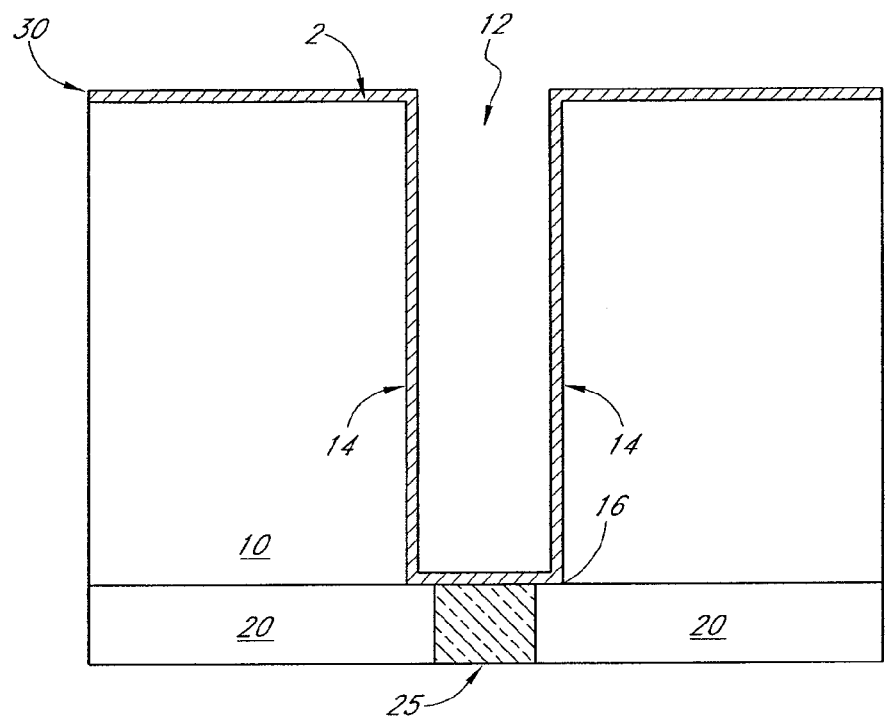

FIG. 1C illustrates the deposition of a sacrificial layer 30 on the upper surface 2 of the structural layer 10 and within the recess 12. Preferably, the sacrificial layer 30 will adhere to the base 16 and sidewalls 14 of the recess 12. The sacrificial layer 30 can be deposited using, for example, a known deposition process, such as chemical vapor deposition (CVD) or plasma enhanced CVD (PECVD). Several preferred sacrificial layers are described in detail below.

Figure 1D:
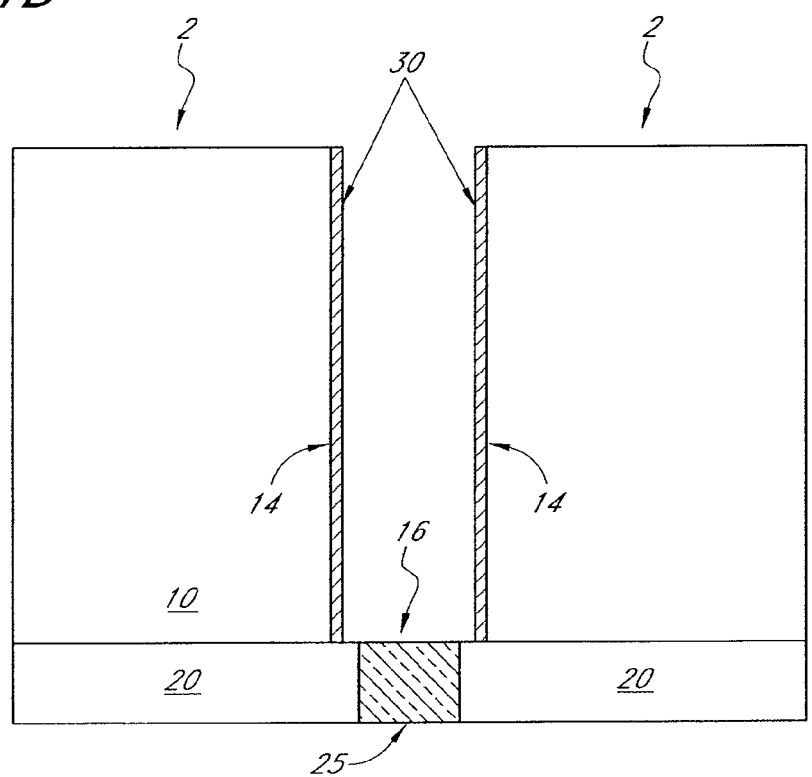

FIG. 1D illustrates the preferred removal of the horizontal portions of the sacrificial layer from the upper surface 2 of the structural layer 10 and from the base 16 of the recess. The removal step exposes the plug 25 for the deposition of the lower electrode. Preferably, removal is performed by a directional etching process, more preferably a dry-etch anisotropic method, such as RIE. The directional etching process preferentially removes horizontal surfaces in a process known as a spacer etch. The directional etch leaves vertical portions of the layers, such as the illustrated sacrificial spacer 30 on the sidewalls 14 of the recess. The spacer etch can be omitted for some embodiments described below, where portions of a conductive sacrificial layer can be left at the bottom of the recess.

Figure 1E:
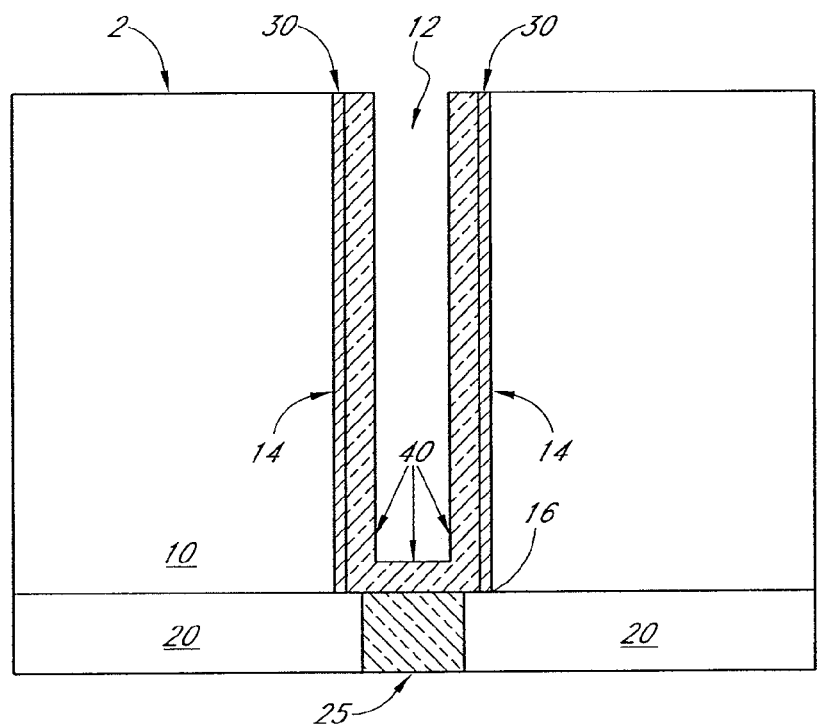

FIG. 1E shows the formation of a lower electrode 40. The lower electrode is formed by depositing a conductive layer within the recess 12 and over the structural layer 10, with the bottom of the electrode material contacting the plug 25. The lower electrode layer 40 is preferably in contact with the sacrificial layer 30 on the sidewalls 14 of the recess 12. However, some embodiments described below employ an intervening protective layer. The via is then filled with a protective filler (e.g., photoresist) and the structure subjected to chemical mechanical planarization (CMP) or other etch back process to leave the structure shown in FIG. 1E. Several conductive materials can be used for the lower electrode. Examples include polysilicon ("poly"), titanium nitride (TiN), elemental metals and metal alloys. The selection of the sacrificial layer is coordinated with the selection of the lower electrode material in order to maintain the structural integrity of the lower electrode during selective removal of the sacrificial layer.

It should be appreciated that the first conductive layer 40 may be deposited using any one of a number of generally known deposition techniques without departing from the scope of the present teachings. The thickness of the lower electrode 40 can vary but preferably leaves room within the recess 12 for subsequent conformal capacitor dielectric and upper electrode layers. Preferably the lower electrode is between about 100 Å and 500 Å thick, more preferably between about 150 Å and 250 Å thick.

Figure 1F:
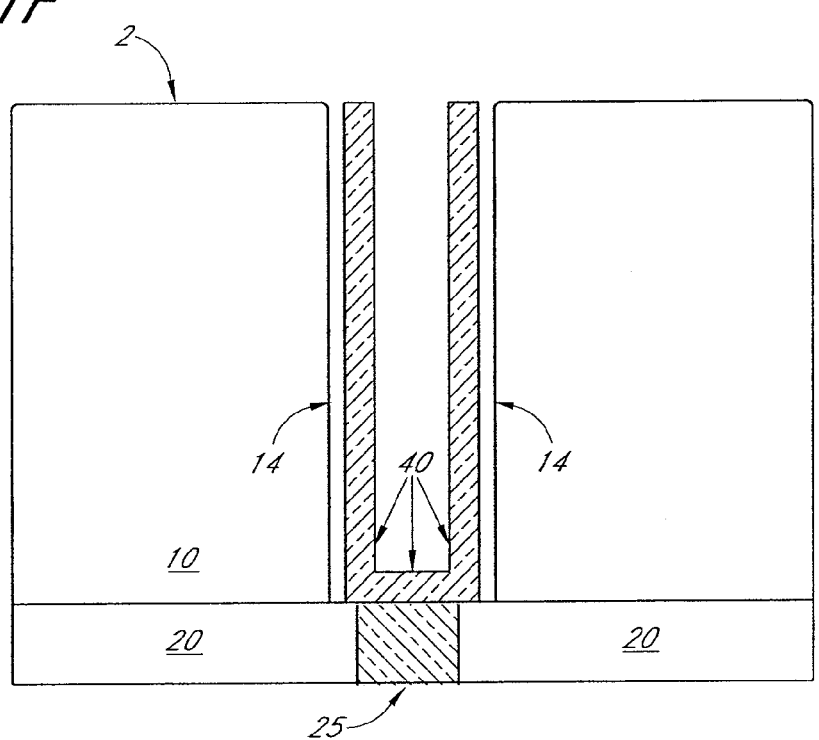

FIG. 1F illustrates the removal of the sacrificial spacers from the sidewalls 14 of the recesses 12. The removal of sacrificial layer allows for access to three surfaces of the structural layer 10 to assist in subsequently removing the structural layer 10. The process for removal of the sacrificial layer varies according to the materials chosen for the sacrificial layer and the surrounding materials that are not to be etched during the removal. The removal of the preferred sacrificial layers is described below.

Figure 1G:
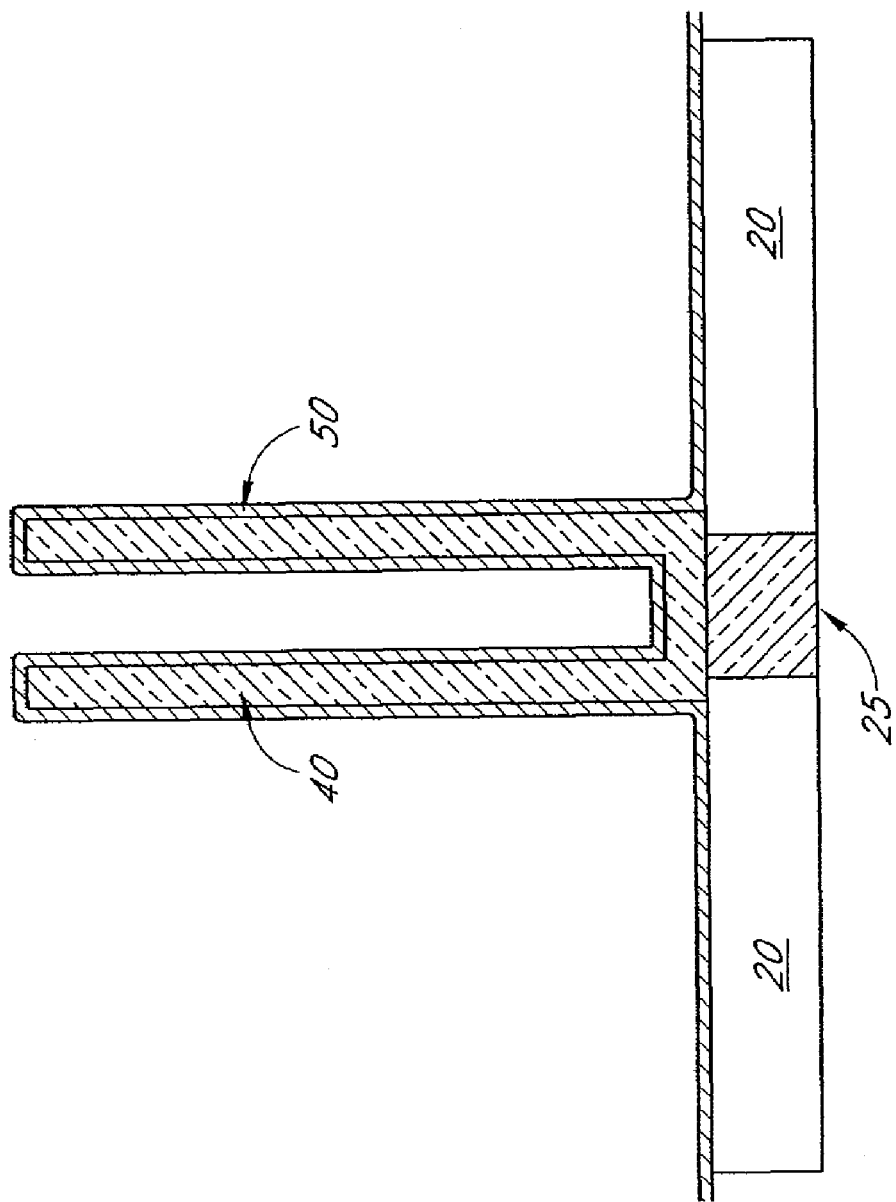

As shown in FIG. 1G, the structural layer 10 (FIG. 1F) is removed preferably by an isotropic etchant. Because the structural layer is an oxide throughout many embodiments, similar etch processes can be used. In one preferred embodiment, a dilute hydrofluoric acid (HF) solution is used to etch the structural layer 10 (FIG. 1F), preferably with an HF concentration by weight is between 2% and 15%, The removal of the sacrificial layer exposes a greater surface area of the lower electrode before the deposition of a conformal capacitor dielectric 50. The dielectric 50 is deposited over the surface of the entire surface of the structure, including over the lower electrode 40 and the area formerly occupied by the structural layer 10. Various materials can be used for the capacitor dielectric 50; examples include nonconductive metal oxides, metal nitrides, and silicon oxides. In a preferred embodiment, the capacitor dielectric is a transitional metal oxide, more preferably an early transitional metal oxide. In many high capacity DRAMs, tantalum pentoxide ($Ta_2O_5$) is used as the capacitor dielectric 50. Tantalum pentoxide is easily deposited by CVD with good step coverage, and has a high dielectric constant ("k value") of between about 20 and 25. Other transitional metal oxides which can be used include hafnium oxide ($HfO_2$) and zirconium oxide ($ZrO_2$). Many other insulators will also function as the capacitor dielectric 50. The thickness of the capacitor dielectric 50 is selected to leave room for the upper electrode, but the thickness can generally be between about 10 Å and 500 Å, depending on the material and the capacitance desired. Deposition of the capacitor dielectric 50 can be performed through well-known processes for deposition of dielectric materials, such as CVD, or by deposition of a metal followed by oxidation.

The removal of the structural layer 10 (FIG. 1F) is facilitated by the removal of the sacrificial spacers. The removal of the structural layer 10, as shown in FIG. 1G, is preferably performed using an isotropic etch, such as a standard oxide wet etch. The spaces formerly occupied by the sacrificial layer can be used to access the structural layer 10 from the sides, in addition to the top of the structural layer 10. Etching from three sides allows for quick removal of the structural layer 10 and minimizes losses of the structural oxide in field regions outside the array (not shown), simplifying planarization of the substrate during further processing.

FIG. 1H illustrates the deposition of an upper electrode 60, or second conductive layer, to form a double-sided container capacitor. In a preferred embodiment, the same material that was used for the lower electrode is used for the upper electrode. Other preferred materials for the second conductive layer include tungsten silicide, elemental metal, or metal alloys. Skilled practitioners will appreciate that many conductive materials can be used for the upper electrode. The thickness of the upper electrode can vary by several orders of magnitude depending on the application, and it can also be made up of several thin layers of conductive materials.

Figure 1I:
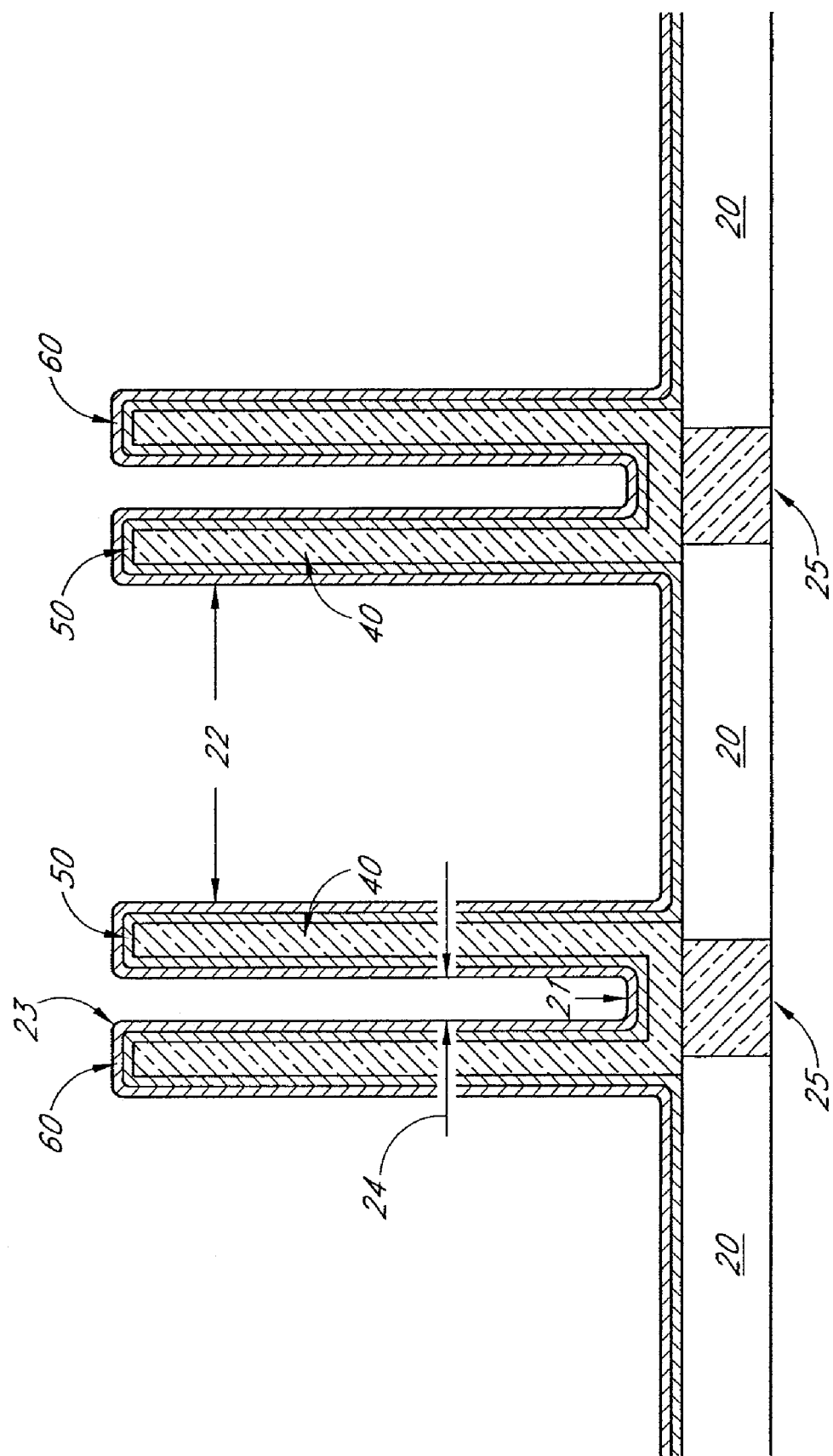
Figure 1J:
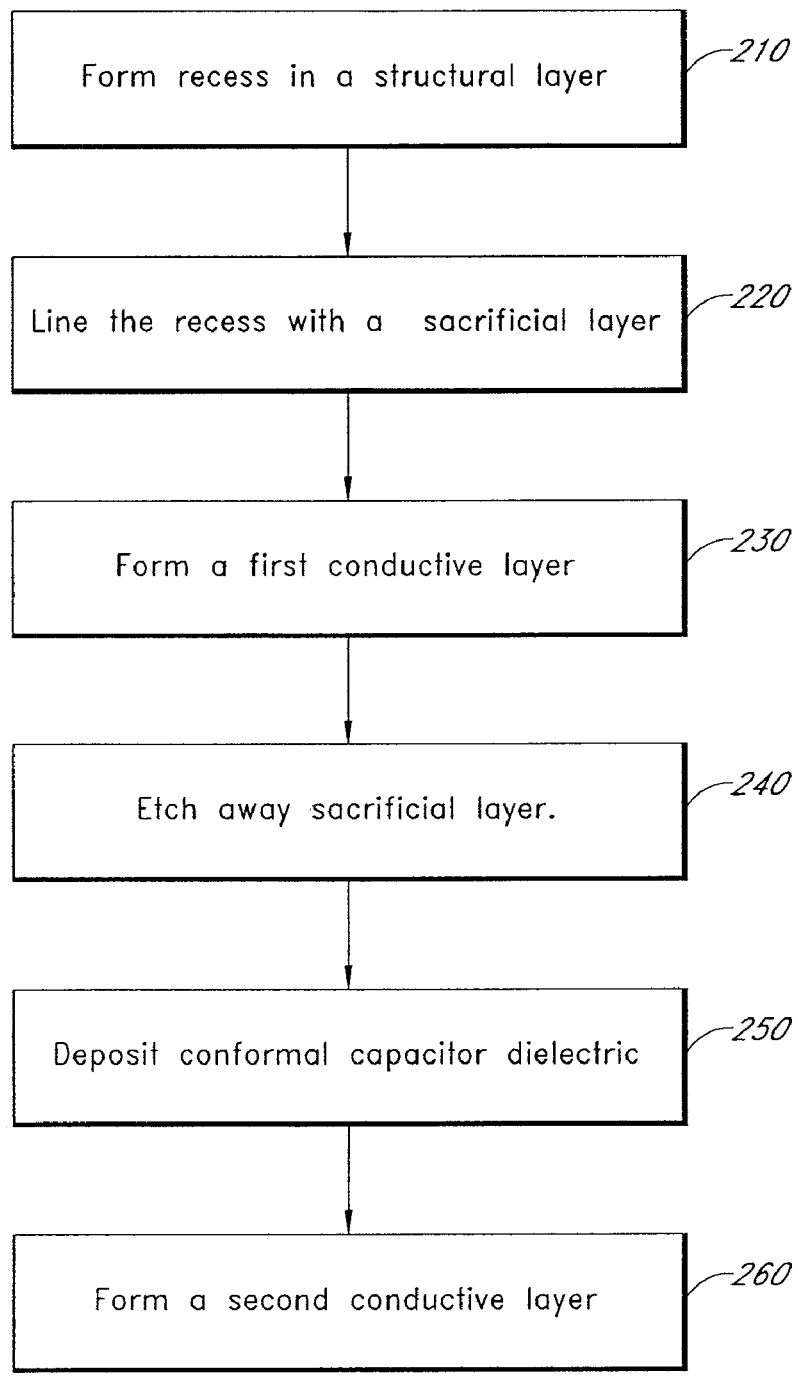
FIG. 1J is a flow chart for the formation of a capacitor according to a preferred embodiment.

The capacitor in FIG. 1H can have several applications. Preferably, the capacitor serves as a memory cell capacitor in a DRAM array. FIG. 1I illustrates the capacitor of FIG. 1H adjacent another capacitor, as would occur in a memory array. The distance between the double-sided containers is preferably between about 60 nm and 150 nm. Additional layers can also be applied over the capacitor illustrated in FIGS. 1A-1I. One example of this is an insulator, such as an ILD layer over the capacitor in order to further electrically isolate the capacitor. Interconnects to other layers and areas of the integrated circuit, including the access circuitry at the periphery of the array, may also be applied to the completed container capacitor. The capacitors can be further processed to form a memory cell, more preferably a DRAM memory cell.

Sacrificial Layers

U.S. patent application Ser. No. 10/714,115, incorporated by reference above, describes the formation of double-sided container capacitors with a sacrificial layer. However, one problem with using sacrificial layers is that etching down a narrow capillary is difficult. The etch process can take a long time, exposing other exposed layers to the etchant in the meantime. Even if the selected etchant is very selective to the structural layer material and the lower electrode material, there will be some etching of the structural layer and the lower electrode. The etching of the lower electrode can cause poorly functioning capacitors. Substantial etching of the structural layer in the field regions outside the array can cause planarization problems in later processing steps.

Additionally, the materials for the sacrificial layer can interact with the lower electrode material. The selection of materials for the lower electrode and the sacrificial layer is preferably coordinated in order to minimize interaction between the two materials that could hinder the removal of the sacrificial layer. FIGS. 2-8 provide particular embodiments of sacrificial layers and lower electrodes.

Use of Enriched PSG as a Sacrificial Layer

In an embodiment shown in FIG. 2A, phosphosilicate glass (PSG) with high phosphorus content is used as the sacrificial layer 110. In a preferred embodiment, the phosphorus content is between about 10% and 24%. More preferably, the phosphorus content is between about 12% and 20%. Preferably the PSG layer 110 is between about 75 Å and 400 Å thick, more preferably between about 100 Å and 250 Å thick.

In a preferred embodiment, the PSG 110 is made by pulsing the precursors in a CVD chamber. A process of depositing a doped oxide is described in U.S. Pat. No. 6,596,641, issued to Jost, et. al., the disclosure of which is herein incorporated by reference. While the '641 patent discusses forming BPSG, PSG can be similarly formed. In fact, an embodiment in the '641 patent describes forming the glass doped with as low as 0% boron, and up to 24% phosphorus. As described, a preferred set of precursors includes triethylphosphate (TEPO), TEOS, and ozone. Table 1 below illustrates one cycle of deposition in a preferred embodiment; the cycle can be repeated to attain the desired layer thickness.

TABLE 1

A preferred PSG deposition process

|  | Step 1 | Step 2 | Step 3 | Step 4 | Step 5 | Step 6 | Step 7 | Step 8 |
|---|---|---|---|---|---|---|---|---|
| Step time | 3 s | 10 s | 10 s | 10 s | 3 s | 10 s | 10 s | 10 s |
| $O_3$ | off | off | on | off | off | off | on | off |
| TEPO | off | off | off | off | on | off | off | off |
| TEOS | on | off | off | off | off | off | off | off |

In a preferred embodiment, the PSG layer 110 is covered by a thin protective layer 112, preferably undoped silicate glass (USG). Preferably, the USG layer 112 has a thickness of between about 10 Å and 30 Å, more preferably between about 15 Å and 25 Å. In FIG. 2A, both the PSG layer 110 and the USG layer 112 are shown within a recess in a structural layer 116. The USG layer 112 protects the PSG layer 110 from subsequent etch steps that are not intended to remove the PSG. In a preferred embodiment, the USG is an undoped oxide deposited from $O_3$ and TEOS.

In FIG. 2B a lower electrode 120 has been formed after a punch through or spacer etch was performed to allow the lower electrode to contact the plug 25 which is surrounded by an ILD layer 20. The PSG sacrificial layer 110 can be damaged during this punch through etch. The high dopant concentration in the preferred PSG sacrificial layer 110 makes the sacrificial layer 110 highly etchable. Even if the etching process is highly anisotropic, a substantial portion of the PSG sacrificial 110 layer can be etched. The illustrated USG layer 112, however, protects the PSG layer 110 during the punch through etch.

The lower electrode 120, as shown in FIG. 2B, is preferably composed of polysilicon ("poly") when the sacrificial layer comprises highly doped PSG. Metallic materials such as TiN, metal alloys and elemental metals could also be used. Because the PSG with high phosphorus content is highly etchable, several etchants can be used to remove the PSG sacrificial layer. The removal of the PSG layer is used to create an etchant ingress for the removal of the structural layer within the memory array.

Figure 2C:
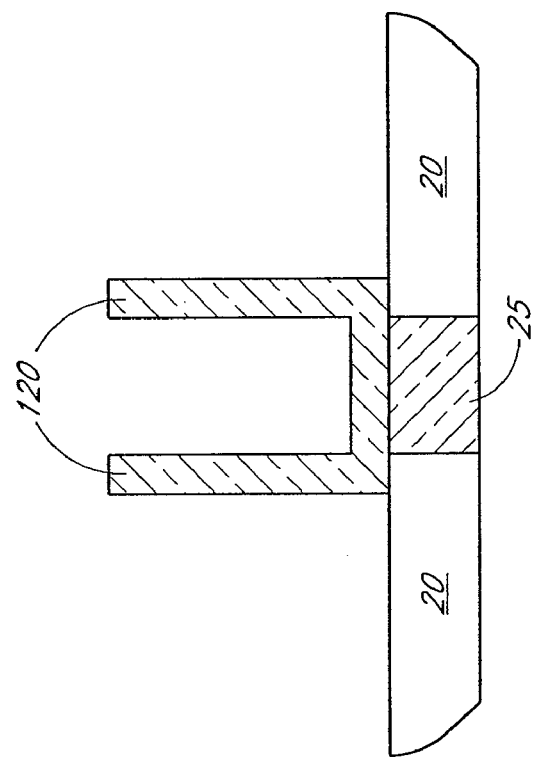

In FIG. 2C, the PSG and USG layers are no longer present. However, some USG may remain after the PSG removal. Any remaining USG will be removed when the preferably oxide structural layer 116 is removed. The PSG will be etched substantially faster than the surrounding layers by an etchant such as an aqueous hydrofluoric acid (HF) etchant solution. In a preferred embodiment the PSG layer 110 is etched at a rate greater than 6000 Å/min, more preferably greater than 7000 Å/min. However, the surrounding layers will be etched a substantially lower rate. This enables for effective selective etching of the PSG sacrificial layer 110 relative to neighboring layers, such as the lower electrode 120 and the structural layer 116. In a preferred embodiment, the PSG is etched using an aqueous HF etchant with an HF concentration of between about 0.5 wt. % and 20 wt. % more preferably between about 8 wt. % and 12 wt. %. The PSG etch process is performed at a temperature range of between about 15° C. and 40° C., more preferably between about 20° C. and 25° C.

Figure 2D:
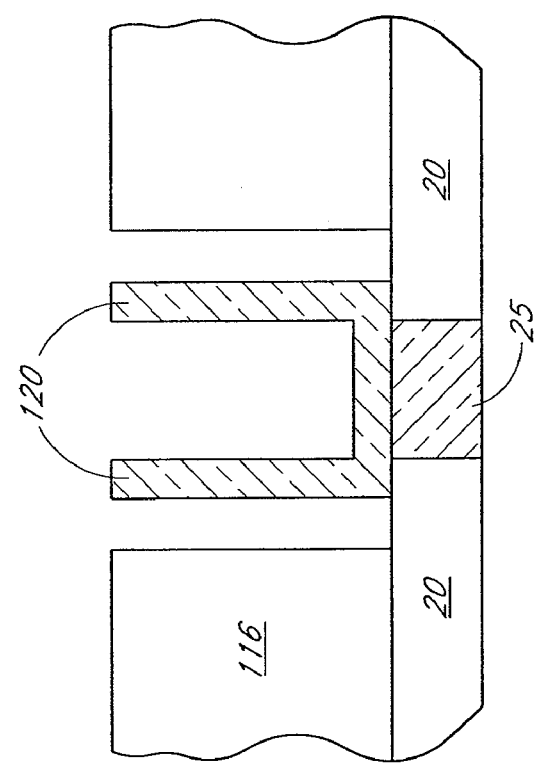

As shown in FIG. 2D, the preferably oxide structural layer 116 is removed, leaving an isolated lower electrode 120. Several methods of removing oxide selective to polysilicon are known to skilled practitioners. Preferred methods of oxide removal include a wet etch process using a fluorinated solution as an etchant, and a fluorine-based plasma etch process. A semiconductor lower electrode of one embodiment is shown in FIG. 2D. As discussed above in the context of forming a double-sided container capacitor, this lower electrode is preferably in a memory array with many other similarly formed lower electrodes. While only one electrode is shown for simplicity in FIGS. 2A-2D, preferably many lower electrodes are formed simultaneously. The lower electrodes can then be used to form double-sided container capacitors as described above with respect to FIGS. 1G-1I above. Preferably, the DRAM cells are completed by further processing.

Use of Germanium Oxide as a Sacrificial Layer

In another preferred embodiment, germanium oxide ($GeO_x$) is used as the sacrificial liner. Germanium oxide can either be in the form of germanium (IV) oxide ($GeO_2$) or germanium (II) oxide (GeO). Preferably the $GeO_x$ layer is between about 100 Å and 500 Å thick, more preferably between about 150 Å and 350 Å thick.

In a preferred embodiment, $GeO_x$ is formed with a high Ge percentage. The standard percentage of germanium in $GeO_2$ is approximately 69% by weight. In a preferred embodiment, the germanium is at least 65% by weight of the $GeO_x$. In a more preferred embodiment, the germanium in the $GeO_x$ is at least 70% by weight. A high content of germanium makes the sacrificial layer very etchable. In fact, with a sufficiently high germanium concentration, the $GeO_2$ layer is water soluble. This allows for a wide variety of etchant possibilities because the sacrificial layer, and other exposed layers, would only need to be exposed to the etchant for a very limited time to remove the sacrificial material. Reducing the exposure time of neighboring layers to the etchant solution decreases the etching of surrounding materials, especially the lower electrode.

Because of its high instability, germanium oxide has traditionally not been grown and used in integrated circuit design. In this context, the germanium oxide need only exist for a limited period of time. In a preferred embodiment, the GeO$_x$ is grown in a CVD chamber. The germanium precursor is preferably an organometallic germanium compound or a germane (e.g. GeH$_4$, Ge$_2$H$_6$, etc.). Preferably, the GeO$_x$ is formed from the reaction of germane (GeH$_4$) an oxygen source in a CVD chamber, particularly where the reactants are activated by plasma.

In a preferred embodiment, a very thin protective layer, preferably an oxide such as USG, is deposited over the GeO$_x$ layer in a similar fashion to the PSG layer discussed above. This will protect the GeO$_x$ layer from subsequent etch, CMP and wet clean steps, as described below. Preferably, the USG layer has a thickness of between about 10 Å and 30 Å, more preferably between about 15 Å and 25 Å. Because the USG layer is thin, it will preferably be etched away by the time the sacrificial layer is removed.

In a preferred embodiment, a polysilicon lower electrode is used with the germanium oxide sacrificial layer. Other conductive materials such as TiN, metals, and metal alloys can also be used as the lower electrode. A CMP step is preferably performed to level the surface of the lower electrode. In one embodiment, the GeO$_x$ and USG layers are then etched using aqueous HF with an HF concentration of between about 0.05 wt. % and 2.0 wt. %, more preferably between about 0.1 wt. % and 0.5 wt. %. The etching of the germanium oxide occurs at a temperature of between about 15° C. and 40° C., more preferably between about 20° C. and 25° C. The etch rate of the GeO$_x$ will be extremely high when using this chemistry. The structural layer, preferably comprising BPSG, is then removed by accessing three sides of the layer with a suitable BPSG etchant.

Figure 3B:
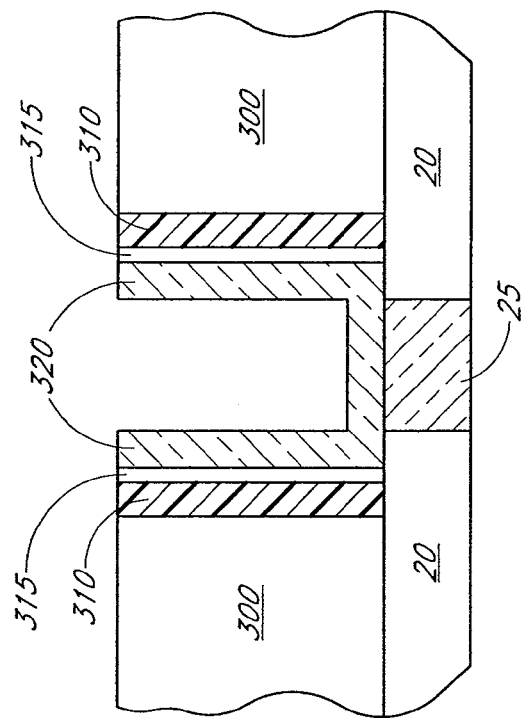
FIGS. 3A-3D illustrate the formation of a lower electrode using germanium oxide as a sacrificial layer in accordance with a preferred embodiment.
Figure 3A:
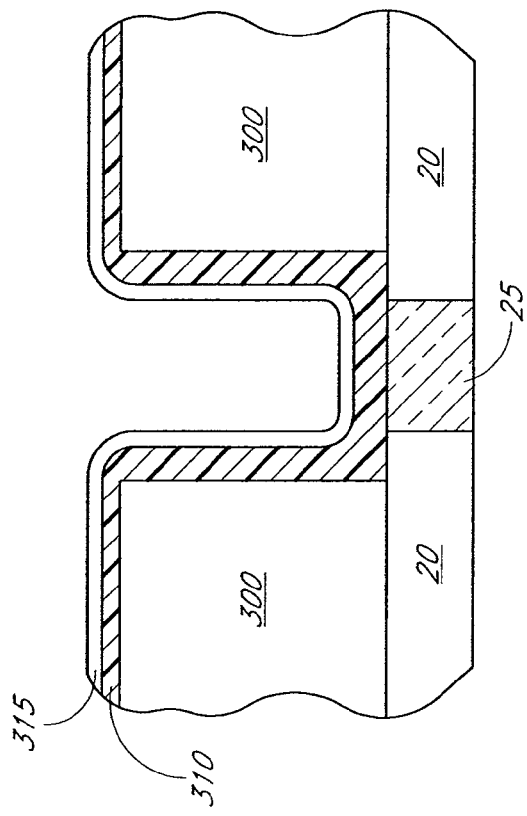

Referring now to FIG. 3A, the sacrificial layer 310 in this embodiment is the GeO$_x$ layer. The germanium oxide layer is instable and can be damaged during a punch through etch. The protective liner 315, preferably USG, is used in a preferred embodiment to protect the sacrificial layer 310. A preferred process flow is similar to the PSG sacrificial layer described above and pictured in FIGS. 3A-3D. A punch-through etch that removes the sacrificial layer 310 and the protective layer 315 from the base of the recess is conducted to allow contact to the plug 25. This punch-through etch is preferably accomplished using a dry etch process with a fluorine-based plasma.

The lower electrode 320 is then formed within the annulus defined by the sacrificial layer 310 and protective liner 315, as shown in FIG. 3B. The USG protective liner 315 prevents removal of the germanium oxide sacrificial layer 310 during the punch-through and CMP steps.

Figure 3D:
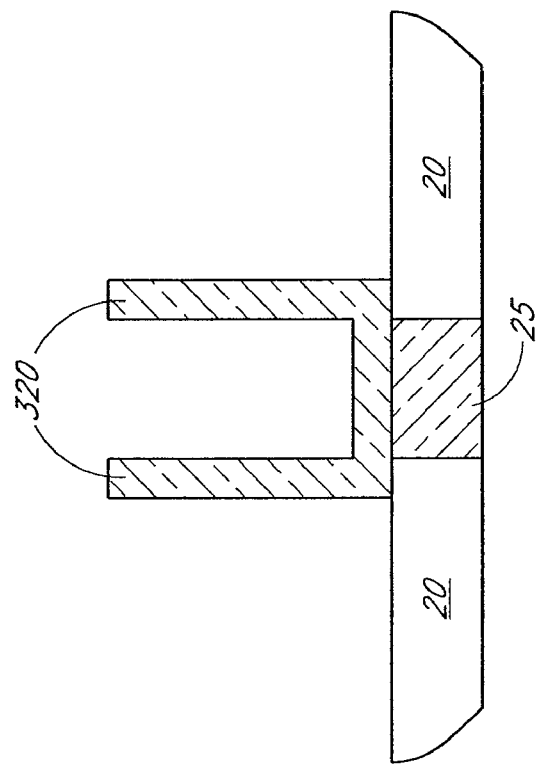
Figure 3C:
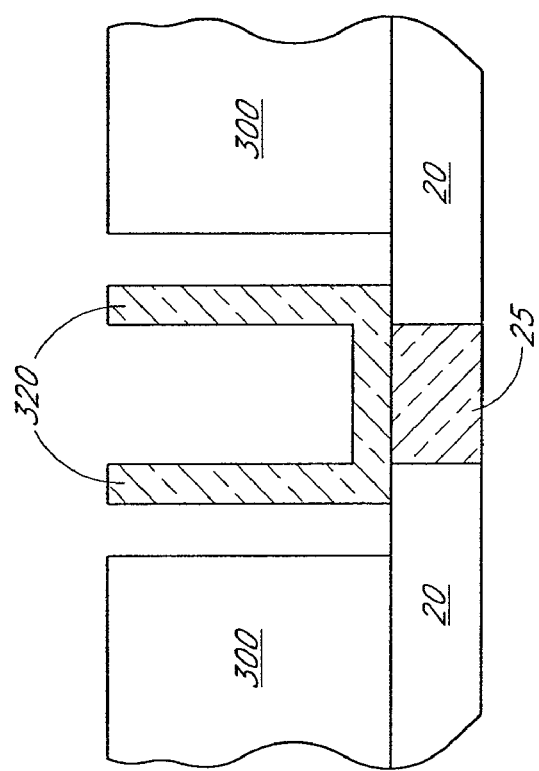

The sacrificial layer 310 is removed, as shown in FIG. 3C. In a preferred embodiment, an aqueous HF etchant is used to remove the sacrificial layer. The etchant solution preferably has an HF concentration of between about 0.1 wt. % and 15 wt %, more preferably between about 0.5 wt. % and 5 wt. %. Temperatures for this process are preferably between about 20° C. and 25° C., comprising an oxide, is removed from the surface of the lower electrode 320 during the removal of the structural layer 300. In a preferred embodiment, the protective liner 315 protects the poly lower electrode after the removal of the sacrificial layer 310.

As seen in FIG. 3D, the removal of the structural layer 300 leaves an isolated lower electrode 320. Methods of removing oxide selective to polysilicon are discussed above, such as using an aqueous HF solution with an HF concentration by weight of between about 2% and 15%. As discussed above in the context of forming a double-sided container capacitor, this lower electrode is preferably in a memory array with many other similarly formed lower electrodes. The lower electrodes can then be used to form double-sided container capacitors as described above with respect to FIGS. 1G-1I above. Preferably, the DRAM cells are completed by further processing.

Use of Doped Oxides as Sacrificial Layers

In another preferred embodiment, a doped silicon oxide is used as the sacrificial layer. Preferably, the glass is borosilicate glass (BSG), phosphosilicate glass (PSG), or borophosphosilicate glass (BPSG), and the total dopant level by atomic percentage is preferably between about 5% and 15%, more preferably between about 8% and 12%. The described dopant levels by weight include the weight of both the phosphorus and the boron. These layers can also be formed by the process of the '641 patent to Jost, et al. Preferably the doped layer is between about 100 Å and 500 Å thick, more preferably between about 125 Å and 300 Å thick. When using this preferred embodiment, the structural layer is preferably a substantially undoped glass. Preferably, the level of dopants in the substantially undoped structural layer is less than about 3%, more preferably less than 2%. Examples of materials for the structural layer include spin-on glass (SOG) and PECVD SiO$_2$.

It is known that doped glass can be etched selectively relative to substantially undoped glass. Preferably, the levels of dopants are selected that will produce good selectivity when etched by either HF vapor or wet chemistries such as acetic acid and HF. Gaseous HF etches doped oxides and leaves the undoped oxides substantially intact. In a preferred embodiment, an aqueous HF solution is used with an HF concentration of between about 0.5 wt. % and 15 wt. %, more preferably between about 2 wt. % and 10 wt. %. The substrate temperature is preferably between about 15° C. and 40° C., more preferably between about 20° C. and 25° C. When using these chemistries, the doped oxides within the mentioned ranges of dopant concentration can be etched selectively relative to the substantially undoped oxide structural layer 10 by magnitudes of up to 4,000 times selectivity.

In a preferred embodiment, a polysilicon lower electrode is used with the doped sacrificial layer. Other materials can also be used as the lower electrode, such as TiN, metals, or metal alloys. A CMP step is performed to level the surface of the lower electrode. Additionally, by removing the upper surface, the electrodes are electrically isolated from each other. Preferably, the sacrificial layer is then etched using aqueous HF. The preferably USG structural layer in the array is then isotropically removed by vapor etch or wet chemistries.

Figure 4A:
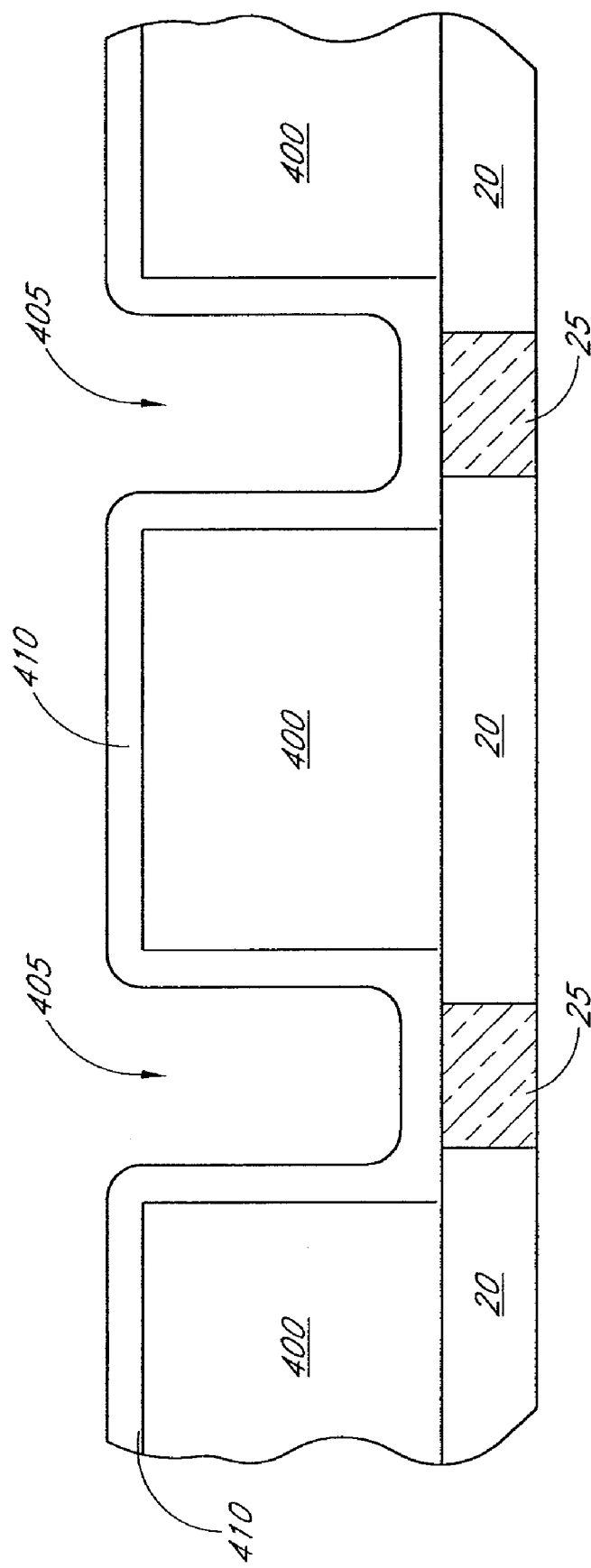
FIGS. 4A-4D illustrate the formation of a lower electrode using a doped oxide as a sacrificial layer in accordance with a preferred embodiment.

FIGS. 4A-4D show an embodiment as described above. Two lower electrodes are shown being formed in these figures, but these electrodes are preferably formed in much larger arrays. In FIG. 4A, a doped oxide layer 410 is deposited within the recess 405 and over the substantially undoped structural layer 400.

Figure 4B:
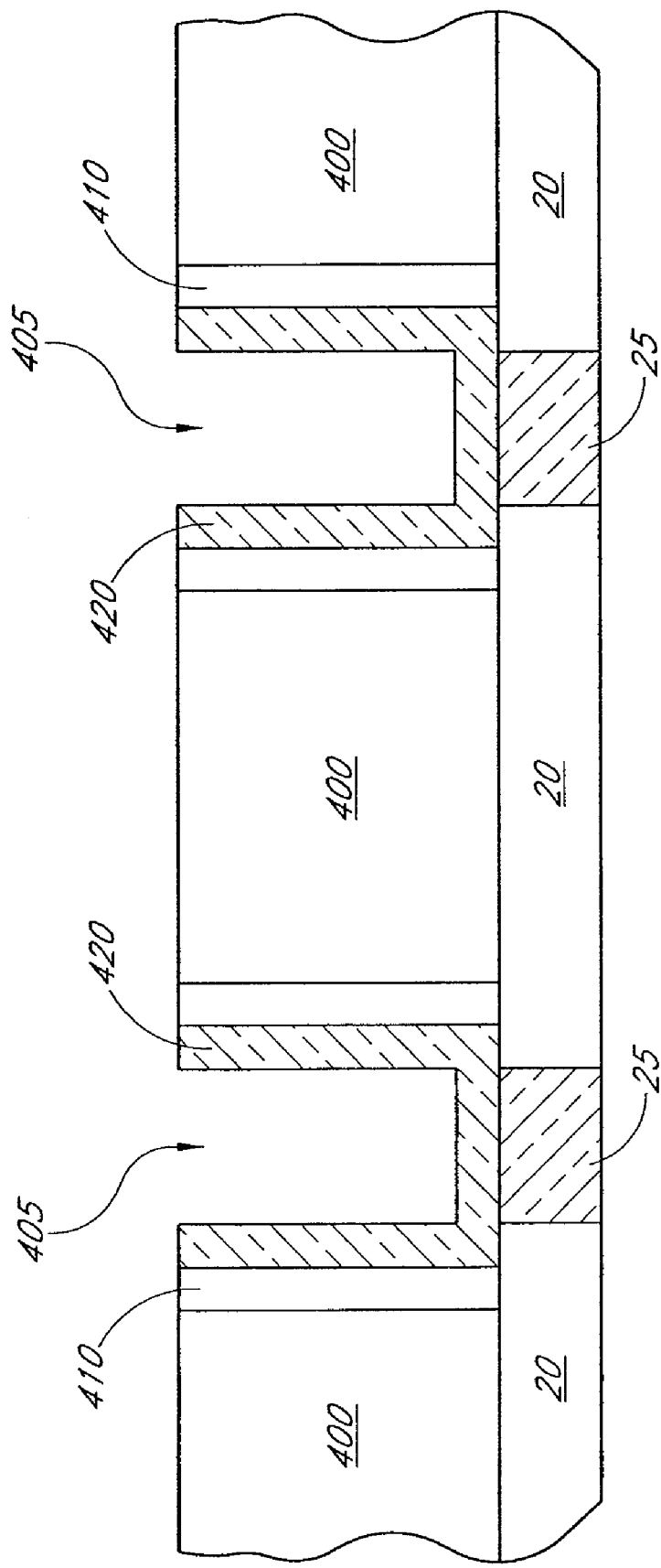

In FIG. 4B, a punch through etch has removed the doped oxide from the surface of the structural layer 400 and the base of the recess 405, which allows for contact with the conductive plug 25. The lower electrode 420, preferably polysilicon, is deposited within the recess 405.

Figure 4C:
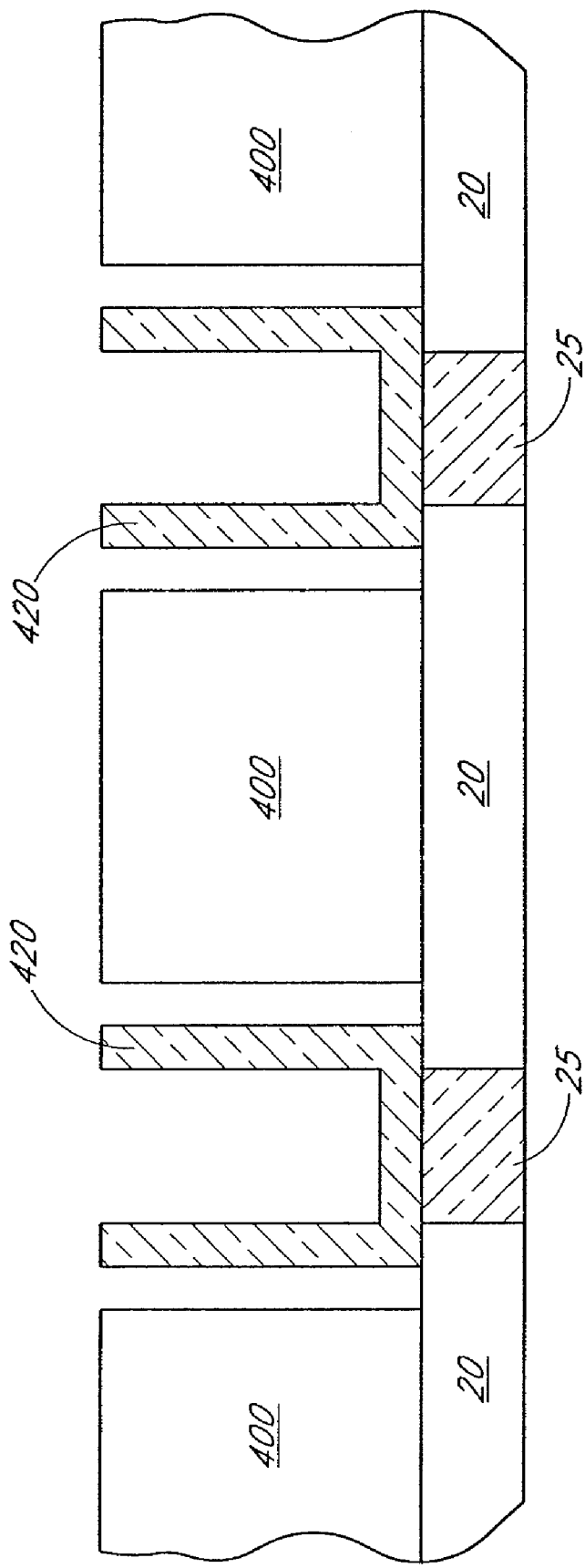
Figure 4D:
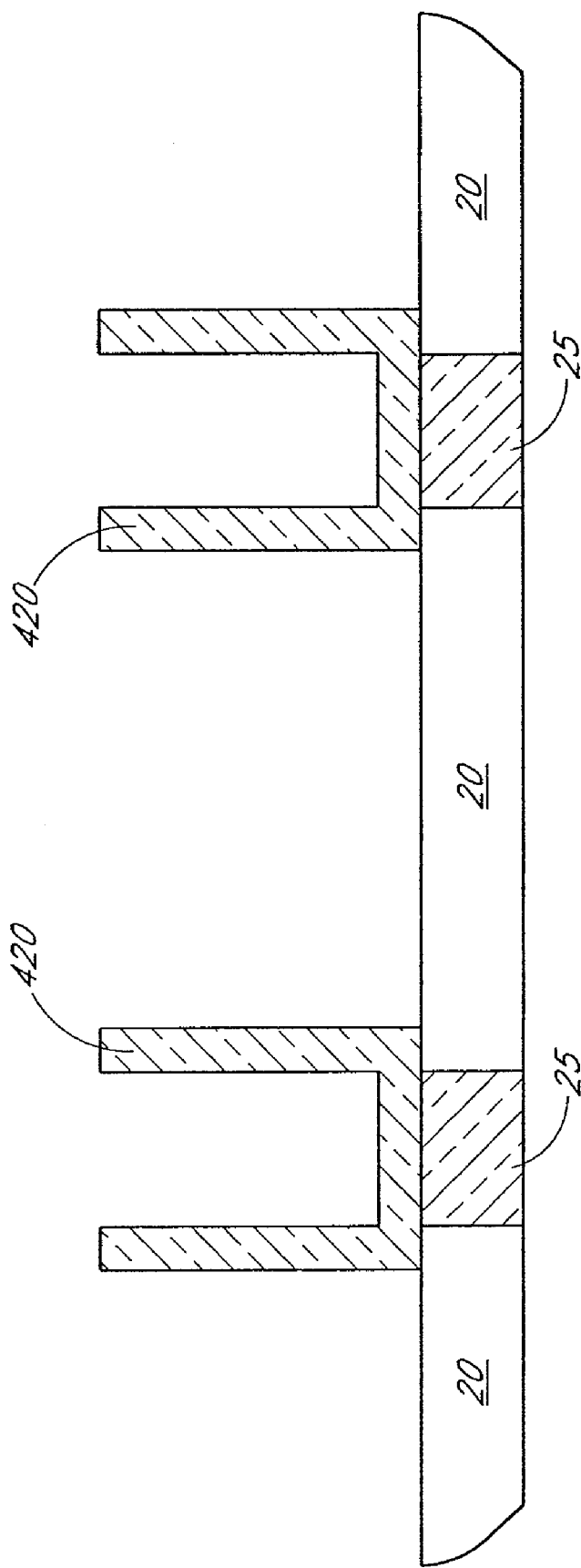

In FIG. 4C, the doped oxide sacrificial layer has been removed using an etchant selective to undoped oxide and polysilicon. In FIG. 4D, the undoped oxide structural layer has been removed, leaving only the lower electrodes 420. In a preferred embodiment, either a vapor or aqueous HF-based etchant is used to remove the oxide selective to poly. Preferably, the concentration of the etchant is between about 1 wt. % and 100%, more preferably about 2 wt. % and 15 wt. %. The temperature is preferably between about 15° C. and 40° C., more preferably between about 20° C. and 25° C.

As seen in FIG. 4D, the removal of the structural layer 400 leaves isolated lower electrodes 420. The lower electrodes can then be used to form double-sided container capacitors as described above with respect to FIGS. 1G-1I above. The double-sided container capacitors can then be used to form DRAM cells.

Use of a Metal Nitride or Metal Oxide Sacrificial Layer

The use of a metal nitride or metal oxide sacrificial layer is described in detail in U.S. provisional patent Application No. 60/606,836, filed Sep. 1, 2004, entitled "Method Of Obtaining Extreme Selectivity to Metal Nitrides and Metal Oxides" of Kevin R. Shea, the disclosure of which is herein incorporated by reference. Exemplary lower electrode materials are polysilicon and titanium nitride (TiN). As discussed in the Shea application, 60/606,836 incorporated by reference above, the metal nitrides and metal oxides are preferably removed by using an ultra dilute or ultra buffered HF etchant. When using a metal nitride or metal oxide, such as HfN or $Al_2O_3$, occasionally the metals diffuse into the adjacent lower electrode. As described in the application, the etchant is extremely selective to the specified lower electrode materials. However, when the metals of the sacrificial layer diffuse into the lower electrode, they can cause the active species (primarily $F^-$ and some $HF_2^-$) of the etchant described in the Shea application, App. No. 60/606,836, to etch the lower electrode. The etching of the lower electrode can cause an increased rate of failures and increased production costs.

In order to solve the problem of lower electrode etching, metals of the sacrificial layer are preferably inhibited from diffusing into the lower electrode material. There are many materials which can be used to prevent interaction between the preferred materials when used as a protective liner between the sacrificial layer and the electrode. The protective liner is also preferably easily removed either when the sacrificial layer is removed, or when the structural layer is removed. In a preferred embodiment, doped and undoped silicon oxides are deposited in very thin layers in order to prevent interaction between the sacrificial layer and the electrode. Silicon oxide is easy to deposit as many tools are available for the deposition of oxide layers. In fact, some current production tools that deposit some of the preferred sacrificial materials (e.g. $Al_2O_3$ and other metal nitrides and metal oxides) can deposit an undoped or doped oxide layer after depositing the $Al_2O_3$.

Preferably, the protective liner is between about 10 Å and 40 Å, more preferably between about 15 Å and 25 Å. Preferred materials for the protective liner include USG, PSG, BSG, and BPSG. As the protective liner is preferably a doped or undoped silicon oxide, the layer will not be removed when the sacrificial layer is removed. The etchant used for the removal of the metal oxide or metal nitride layer is preferably very selective against the oxide of the structural layer. When the structural layer, preferably BPSG, is removed after the lower electrode is deposited, the oxide liner will also be removed by a selective oxide etch.

The removal of the sacrificial spacers is preferably performed by a HF solution having a low percentage of the $H_2F_2$ species of hydrogen fluoride. One form of such an etchant is an ultradilute HF solution. In a preferred embodiment, the ratio of water to HF is between about 1,000 to 1 and 10,000 to 1. Another embodiment of an etchant with a low percentage of the $H_2F_2$ species of hydrogen fluoride is an ultrabuffered solution. Preferably, the pH of such a solution is between about 3.5 and 5.5. More preferably, the pH of the buffered solution is between about 4.0 and 5.0. The wafer is preferably heated to a temperature of between about 50° C. and 90° C., more preferably between about 60° C. and 85° C.

Figure 5B:
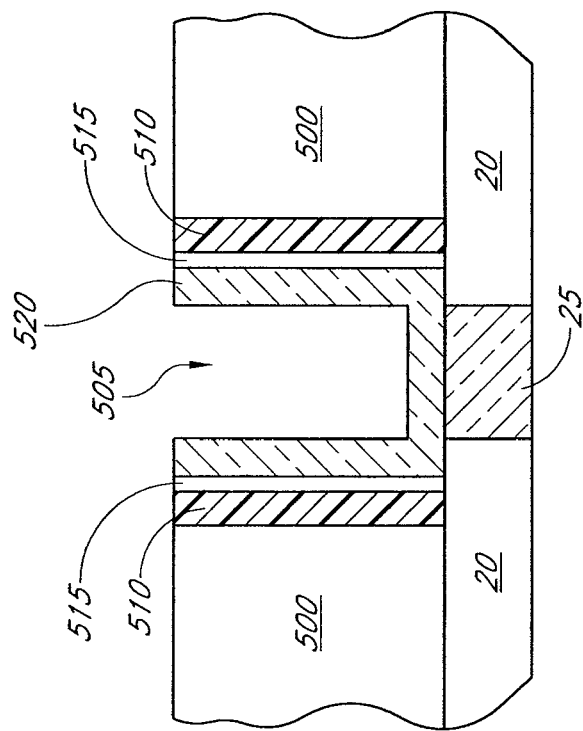
FIGS. 5A-5D illustrate the formation of a lower electrode using a metal oxide or metal nitride as a sacrificial layer in accordance with a preferred embodiment.
Figure 5A:
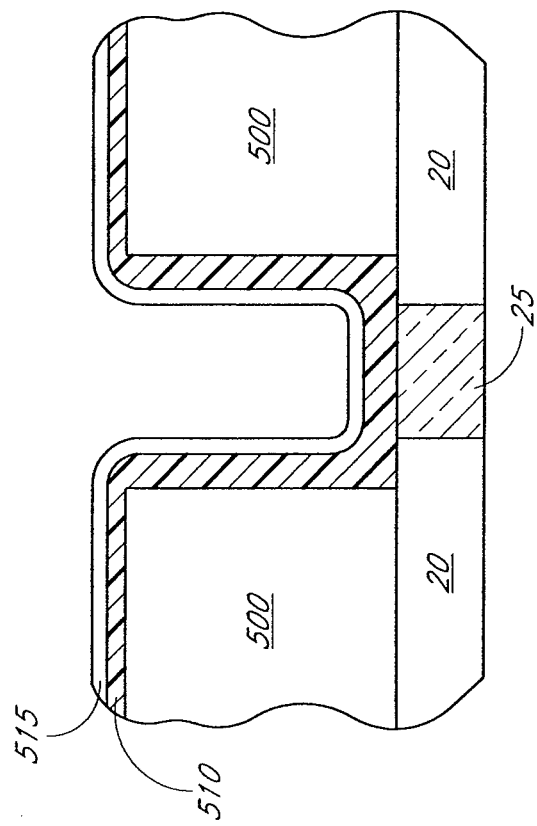
Figure 5D:
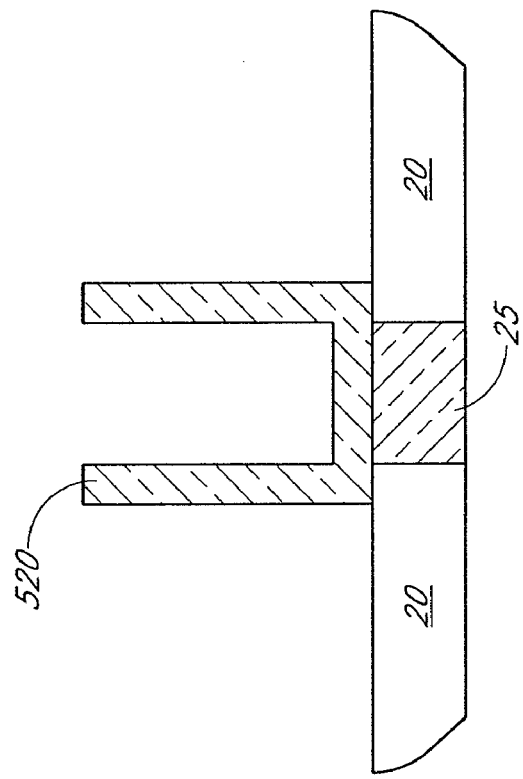
Figure 5C:
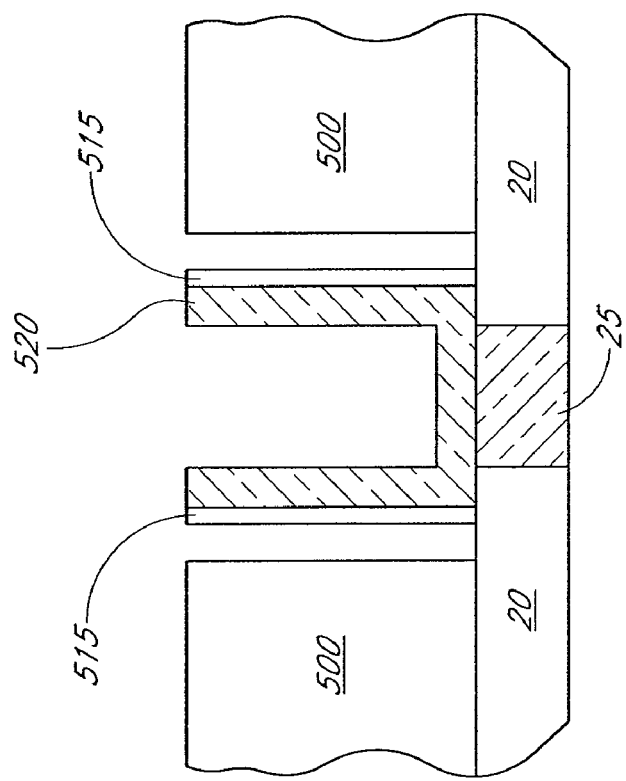

An embodiment is illustrated in FIGS. 5A-5D. A metal nitride or metal oxide sacrificial layer 510 is deposited over the structural layer 500 and within the recess 505. In the illustrated embodiment, the structural layer 500 is BPSG. A protective oxide liner 515 is deposited over the sacrificial layer 510. A punch through etch removes these layers from the surface of the structural layer 500 and the base of the recess 505. FIG. 5B illustrates the structure after the lower electrode 520 has been formed. In preferred embodiments, the lower electrode 520 is selected from the group consisting of poly, titanium nitride, and tungsten. FIG. 5C illustrates the structure after the removal of the sacrificial layer 510 using an ultradilute or ultrabuffered solution as described above. FIG. 5D illustrates the isolated lower electrode 520 after the removal of the structural layer 500 (FIG. 5C) and the protective liner 515. Methods of removing the structural layer 500 are discussed above. The lower electrode, and its neighbors in the memory array, can then be used to form double-sided container capacitors. The container capacitors can then be used to form DRAM memory cells in an array.

Polysilicon Layer as a Sacrificial Layer

In another preferred embodiment, polysilicon is used as a sacrificial layer. In this embodiment, the lower electrode is preferably a metallic material, such as TiN, tungsten (W), ruthenium (Ru), or platinum (Pt). Many etchants are available for polysilicon that are selective to metallic materials which can be used as the lower electrode, and are also selective to materials that are used in the structural layer, typically a form of silicon oxide.

However, when using polysilicon sacrificial layers, it is difficult to control the etch process. For many processes it is desirable to retain a portion of the sacrificial layer so that the entirety of the container is not exposed or to avoid undesired etching of underlying materials. Polysilicon sacrificial layers, for example, could benefit from an etch stop in order to control the depth up to which the outside of the containers are exposed and to minimize risk that the underlying polysilicon plug gets damaged. Forming and controlling the etch stop layer can be done in several ways.

In a preferred embodiment, a collar is formed as a local source of dopant in the structural layer, which is preferably a form of oxide such as BPSG. The collar is preferably a heavily doped oxide layer, preferably BSG or PSG. The dopant of the oxide will diffuse into the poly sacrificial layer and cause a thin section of the sacrificial layer to be doped. The doped poly layer would have a different etch rate than the rest of the sacrificial layer, thus forming an etch stop layer. The skilled artisan will appreciate that such a collar can provide local doping as an etch stop for a variety of other sacrificial materials.

Figure 6B:
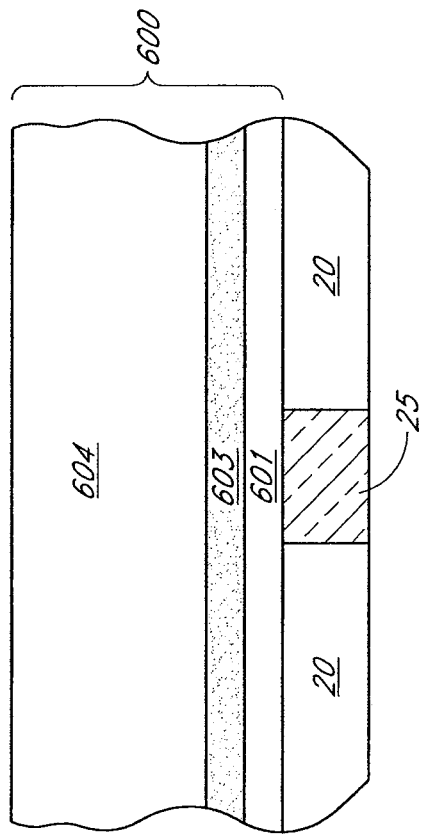
Figure 6A:
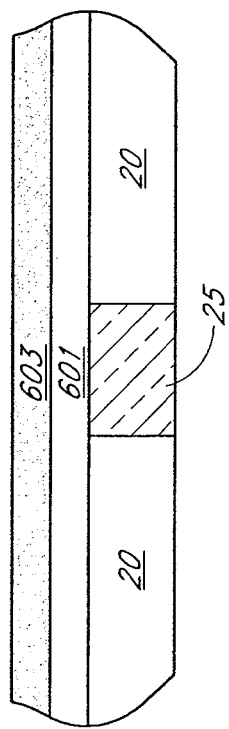

As shown in FIGS. 6A and 6B, the structural layer 600 includes a lower structural layer 601 and a collar 603 formed preferably between about 250 Å and 1500 Å above the ILD layer 20, more preferably between about 500 Å and 1000 Å. The collar 603 is preferably formed during the oxide deposition of the structural layer 600 and is preferably between about 100 Å and 1,000 Å thick, more preferably between about 200 Å and 500 Å. In a preferred embodiment, the lower structural layer 601 is formed as a thin (e.g. 250 Å-1500 Å) layer from the material of a standard structural layer. The lower structural layer 601 is preferably an oxide such as BPSG, USG, BSG, or PSG. The formation of this layer is stopped at the desired collar height. To create the collar 603, a process such as the process described in the '641 patent to Jost, et al. can be used to form a more heavily doped oxide. For a PSG collar 603, the collar has a phosphorus concentration by weight of between about 10% and 25%, more preferably between about 12% and 20%. For a BSG collar 603, the collar has a boron concentration by weight of between about 10% and 15%, more preferably between about 11% and 14%. Skilled artisans will appreciate that there are other methods of forming a collar with a dopant level in the preferred ranges. Once the desired thickness of the collar 603 is formed, the upper structural layer 604 is formed of a similar material as used to form the lower structural layer 601. The deposition of the upper structural layer 604 is illustrated in FIG. 6B.

In a preferred embodiment illustrated in FIG. 6C, a recess 605 is formed within the structural layer 600 to a depth of between about 1500 Å and 2500 Å. As illustrated in FIG. 6D, a poly sacrificial layer 610 is formed within the recess after the recess 605 has been formed within the structural layer 600. In a preferred embodiment, a spacer etch is preformed to expose the plug 25. After the spacer etch, the lower electrode is formed within the recess. FIG. 6D shows the structure after the sacrificial layer 610 has been prepared and the lower electrode has been formed and the structure has been etched back by an etching process such as CMP.

Figure 6F:
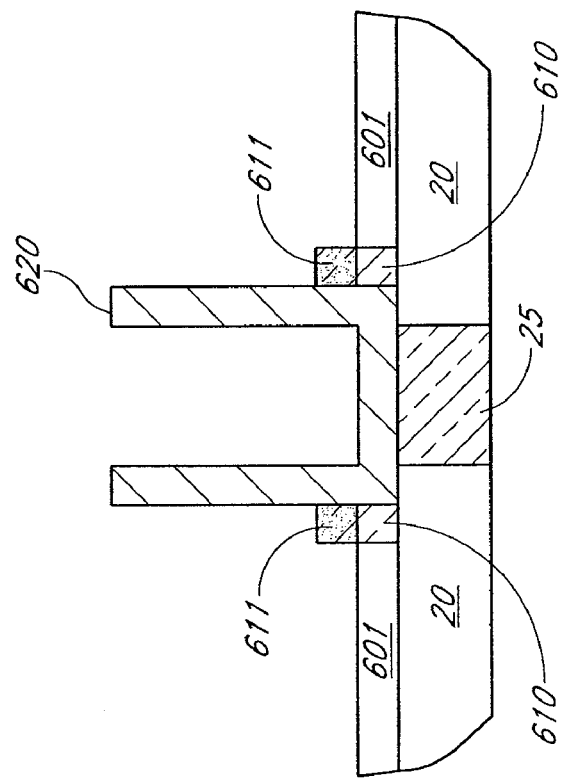
Figure 6E:
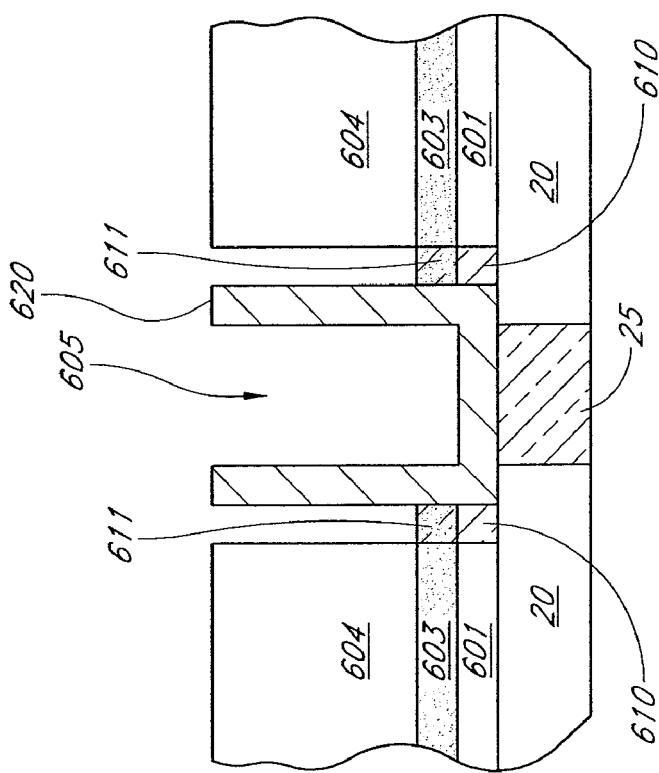

The dopant from the collar 603 will diffuse into the poly sacrificial layer 610 to form an etch stop layer 611. In FIG. 6E the sacrificial material over the etch stop layer 611 has been removed. This creates an access space to allow an etchant to contact the structural layer from three sides. In FIG. 6F, the upper portion of the structural layer 604 and the collar 603, has been removed. The lower structural layer 601 can also be removed. In an embodiment shown in FIG. 6G, the etch stop layer 611 and the remaining sacrificial layer 610 is also removed.

The sacrificial layer is etched by an etchant which etches undoped or low doped poly selective to doped poly. In a preferred embodiment where the collar 603 is BSG, the etch stop layer 611 will be a p-doped layer because boron is a p-type dopant. The poly sacrificial layer 610 can also be slightly n-doped in this embodiment. The non-p-doped portion of the poly sacrificial layer 610 can preferably be etched using "hot" TMAH (tetramethylammonium hydroxide). TMAH etches p-doped poly and other types of poly at substantially different rates. TMAH etches undoped poly at approximately 1 micron per minute, but etches p-doped poly at approximately 0.01 μm/min. Because of the difference in etch rates, the etch process can be stopped when the TMAH reaches the p-doped poly layer. In this preferred embodiment, the TMAH etch process is preformed at a temperature of between about 40° C. and 100° C., more preferably between about 50° C. and 70° C., with concentration levels of TMAH between about 1 wt. % and 25 wt. %, more preferably between about 5 wt. % and 25 wt. %.

When PSG is used as the collar, the phosphorus diffusing into the poly sacrificial layer makes the poly layer n-doped. However, TMAH and other ammonium based etchants do not respond well to n-doped etch stop layers unless they are very heavily doped. The difference in etch rates is generally much smaller for n-doped layers and substantially undoped poly than the difference in etch rates between p-doped layers and substantially undoped poly. Because of this p-doped etch stop layers are more preferred than n-doped etch stop layers.

Figure 6G:
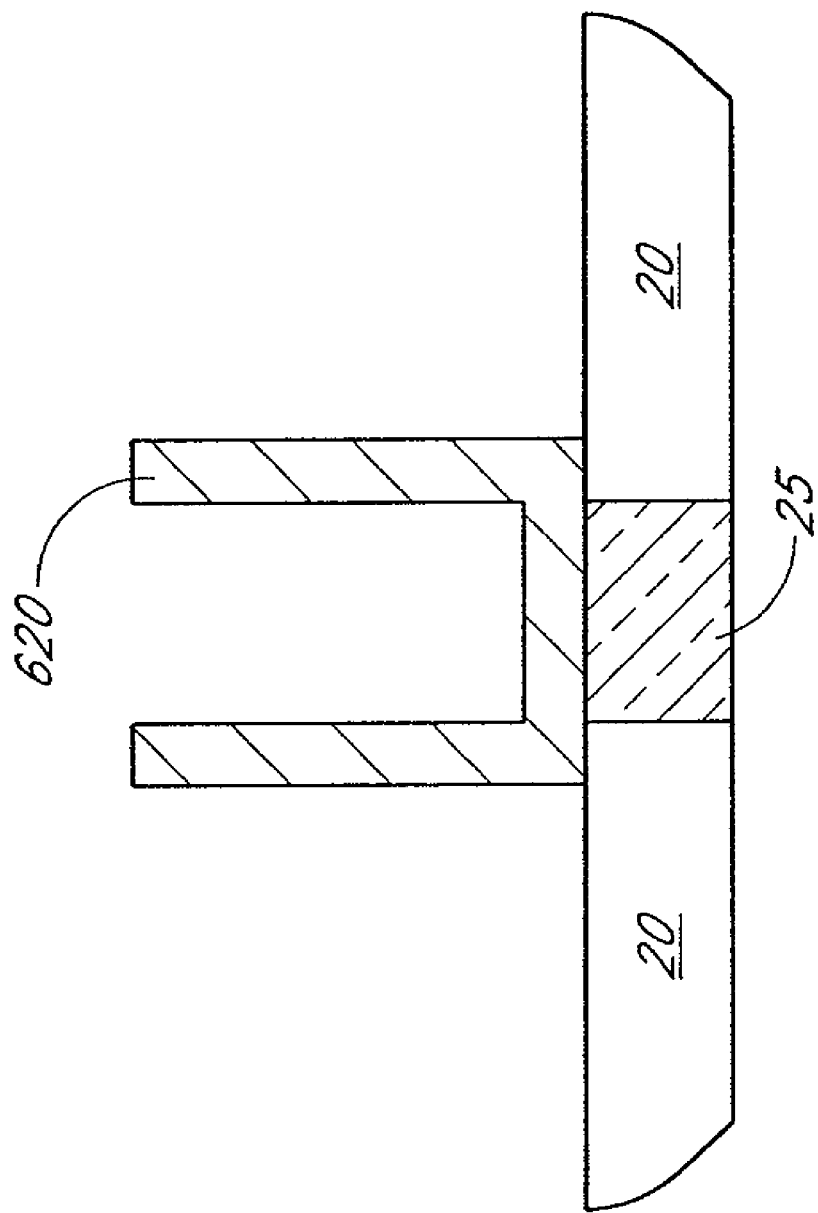

FIG. 6G shows an embodiment where the thin lower structural layer 601 has been removed. Whether or not this layer is removed, the isolated lower electrode can be completed with a capacitor dielectric and a top electrode. The capacitor can be processed further to form a memory cell.

In one embodiment, the structural layer 600 can then be removed faster than without using the sacrificial process flow using the space created by removing the sacrificial material above the etch stop layer. FIG. 6F illustrates the removal of the structural layer. The remaining sacrificial material can either remain there, or it can be removed by a separate poly etch process. In another embodiment, the lower portions of the structural layer are not removed. For example, the collar 603 and the lower portion 601 of the structural layer could remain in place. Because both of these layers 601 and 603 are insulating oxides, there is no concern of shorting the capacitors to each other.

Figures 7A, 7B:
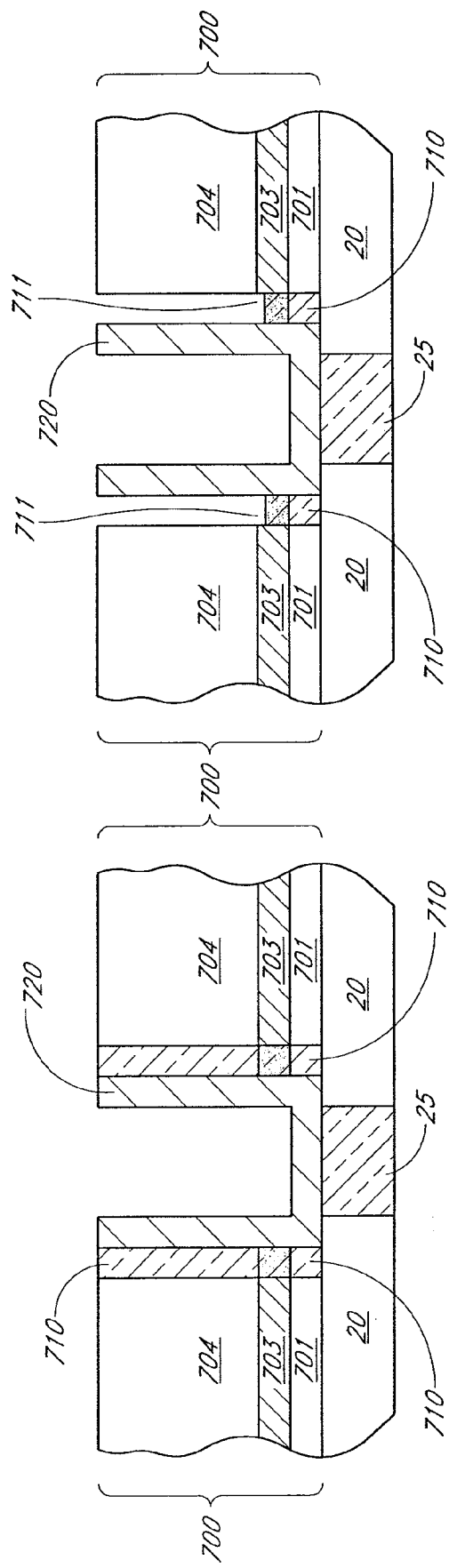
FIGS. 7A-7E illustrate the formation of a lower electrode using a metal collar with polysilicon as a sacrificial layer in accordance with a preferred embodiment.

In another embodiment shown in FIG. 7A, the collar 703 could be made of diffusing metallic materials, such as tungsten, titanium oxide, or aluminum oxide. The metal of these materials diffuses into the poly sacrificial layer 710, creating an etch stop layer 711. The collar is preferably between 10 Å and 1500 Å above the underlying ILD layer 20, more preferably between 20 Å and 750 Å above the ILD layer 20. Preferably, the thickness of the metallic collar 703 is between about 50 Å and 1,000 Å, more preferably between about 100 Å and 700 Å. In the embodiment shown in FIG. 7A, the collar is substantially above the ILD layer 20.

FIG. 7B illustrates the structure after the sacrificial layer 710 is removed above the etch stop layer 711. In a preferred embodiment, the poly is removed using a poly etchant which will etch undoped or lightly doped poly substantially faster than metal-doped poly, or metal silicide, etch stop layer 711. This will allow the poly to be etched selectively to the doped etch stop layer 711. Preferred etchants include bases such as TMAH or KOH. Preferred concentrations of one preferred etchant, TMAH, are between about 1 wt. % and 25 wt. %, more preferably between about 5 wt. % and 25 wt. %. Temperatures for this process are preferably between about 20° C. and 100° C., more preferably between about 50° C. and 70° C. Part of the etch stop layer 711 may also be removed during the removal of the sacrificial material above the etch stop layer 711, depending on etch conditions.

Figure 7C:
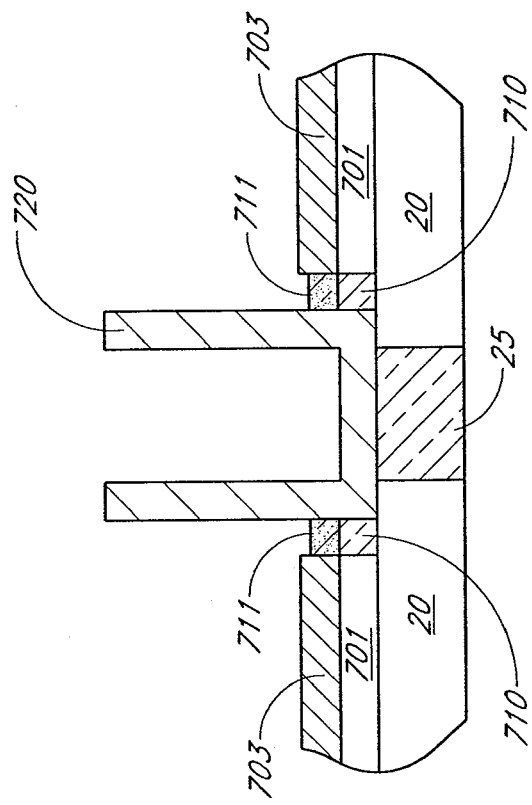

FIG. 7C illustrates the removal of the upper structural layer 704, which is preferably an oxide. The removal is preferably selective to other exposed layers, including the metallic lower conductor 720 and the etch stop layer 711. An isotropic wet etch is used to remove the upper structural layer 704 in a selective oxide etch process. Preferred etchants include fluorinated solutions. Skilled practitioners will appreciate that there are several methods of removing an oxide layer without substantially damaging exposed metallic layers.

Some of the metallic materials of the collar 703 create a risk of shorting the capacitors to one another. When the etch stop layer is reached in the etch process, the wet etch chemistry is changed to recess back the metallic collar 703 in order to prevent shorting. FIG. 7C also illustrates the etching of the metallic collar. Because the etch is isotropic, the metallic collar 703 will be recessed down and away from the lower electrode 720. However, the complete removal of the metallic collar is unnecessary. An electrically unconnected portion of the metallic collar layer 703 can be isolated by the deposition of a capacitor dielectric. Preferably, the etchant to recess the metallic collar does not substantially etch undoped polysilicon, oxide and titanium nitride. In a preferred embodiment, an HF solution is used to recess the metallic layer. Preferably, the concentration of the HF solution is between about 0.5 wt. % and 20 wt. %, more preferably between about 2 wt. % and 10 wt. %. Temperatures for this process are preferably between about 15° C. and 80° C., more preferably between about 20° C. and 25° C.

Figure 7D:
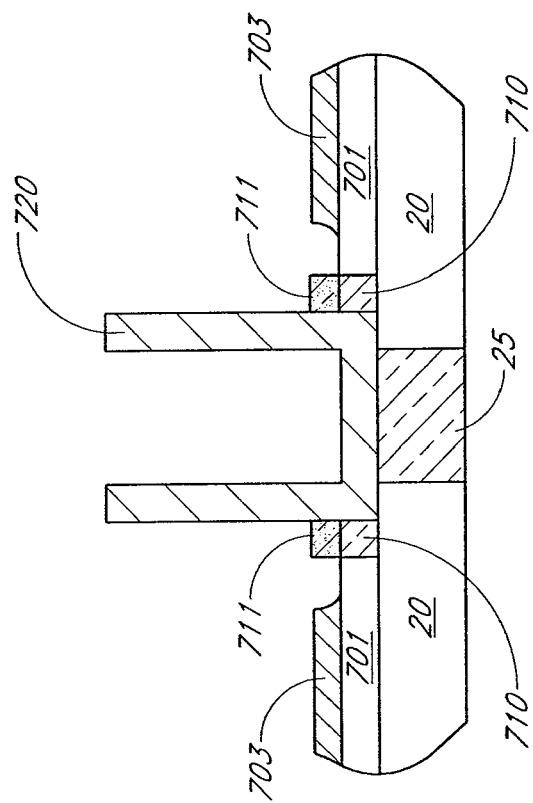
Figure 7E:
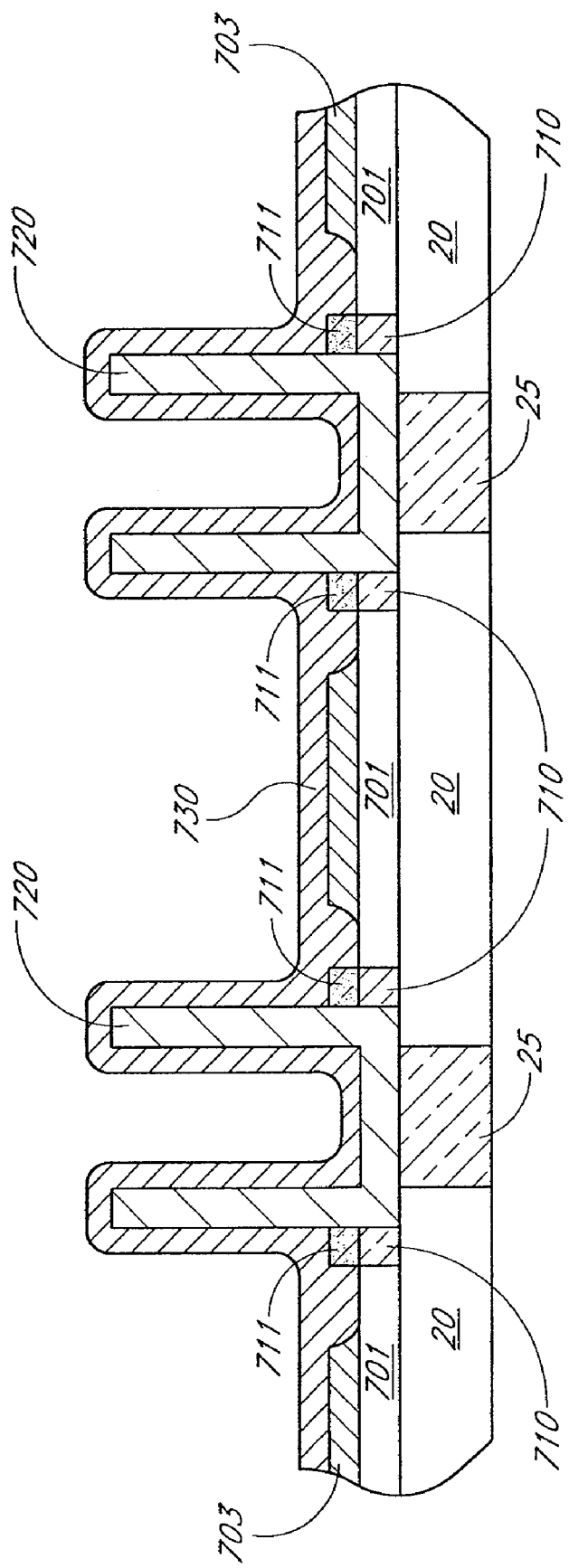

FIG. 7D shows two lower electrodes with a conformal capacitor dielectric 730. In a preferred embodiment, the capacitor dielectric is tantalum oxide as discussed in reference to FIG. 1G. A portion of the polysilicon sacrificial layer 710 and the etch stop layer 711 may remain, but should not significantly affect the performance of the capacitor. Additionally, structural oxide material 701 can remain beneath the collar 703 material and the conformal capacitor dielectric 730.

Figure 8B:
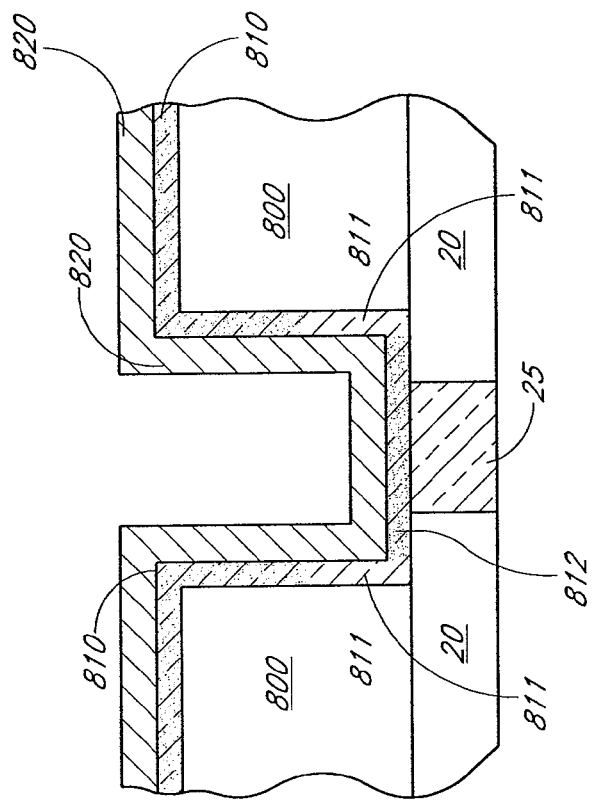
FIGS. 8A-8E illustrate the formation of a lower electrode using an implanted polysilicon sacrificial layer in accordance with a preferred embodiment.
Figure 8A:
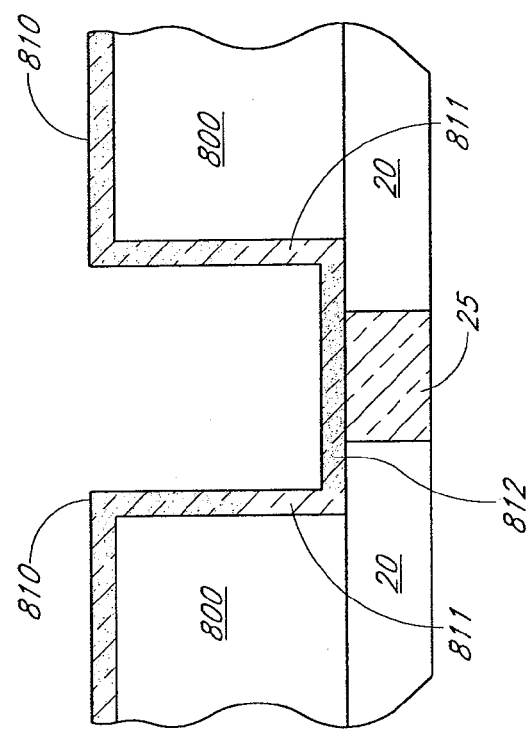

In another embodiment seen in FIG. 8A, a poly sacrificial layer is deposited over the array of recesses. The poly layer 810 is implanted with ions. Standard ion implantation tools can be used to implant the ions into the polysilicon sacrificial layer. Ion implantation is a process by which ions of a material can be implanted into another solid in order to change the physical properties of the solid. Implantation can change the material properties of the target material, particularly by altering the electron band gap and crystal structure of the affected portion. Materials that can be used as the source of ions include argon, nitrogen, boron, and phosphorus.

The depth that the ions reach is determined by the energy (i.e. the velocity) of the ions. Concentration of the ions is controlled by the concentration of ions in the ion beam. Additionally, the concentration can be increased by multiple passes through the ion beam. Examples of preferable ion implantation tools include Applied Materials' (San Jose, Calif.) Quantum implanter and Axcelis' (Beverly, Mass.) HE Ion Implant Device.

Referring now to FIG. 8A, ions will be implanted between about 500 Å and 1500 Å into the sacrificial layer 810 along the sidewalls. The lower vertical portion 811 of the poly layer serves as an etch stop layer. Additionally, the portion 812 of the sacrificial layer along the bottom of the recess is preferably heavily implanted. Preferably, the implant dose is between about $1 \times 10^{12}$ cm$^{-2}$ and $4 \times 10^{15}$ cm$^{-2}$, more preferably between about $1 \times 10^{14}$ cm$^{-2}$ and $2 \times 10^{15}$ cm$^{-2}$. The energy of the implantation is between about 1 keV and 20 keV, more preferably between about 2 keV and 10 keV. Depending on the ion selected to implant in the sacrificial layer and the concentration, the sacrificial layer will have varying layers of electrical conductivity. A punch-through etch could be performed if the bottom portion of the sacrificial layer is not sufficiently conductive after the ion implantation.

As seen in FIG. 8B, after the poly sacrificial layer 810 and the base of the poly layer 812 is implanted with ions, a metallic lower conductor 820 is deposited. Preferred materials include titanium nitride, metals, and metal alloys. The sacrificial layer 810 and the lower conductor 820 are preferably removed above the structural layer 800, preferably in a CMP step.

Expose portions of the implanted sacrificial layer 810 are preferably then etched away with an etchant that etches the implanted poly 810 selective to the poly which was not implanted 811. A preferred etchant is TMAH, with a concentration of between about 2 wt. % and 25 wt. %, more preferably between about 20 wt. % and 25 wt. %. Preferably, the temperature for the etch process is between about 20° C. and 100° C., more preferably between about 50° C. and 70° C. The unimplanted portion of the poly sacrificial layer acts as an etch stop for the etch process.

Figure 8D:
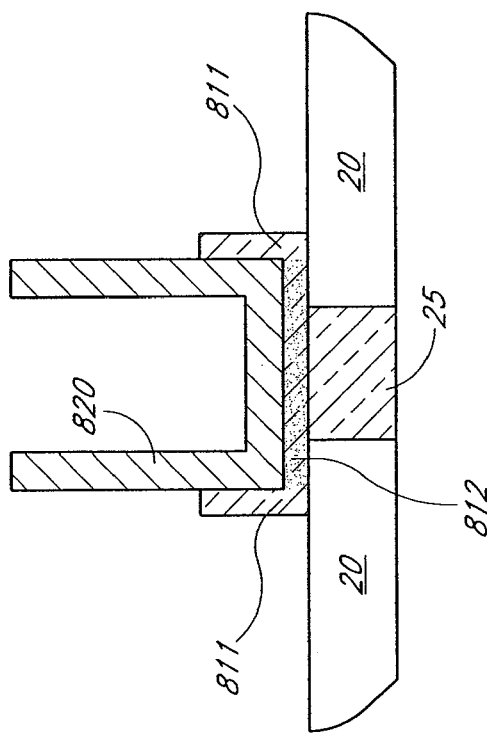
Figure 8C:
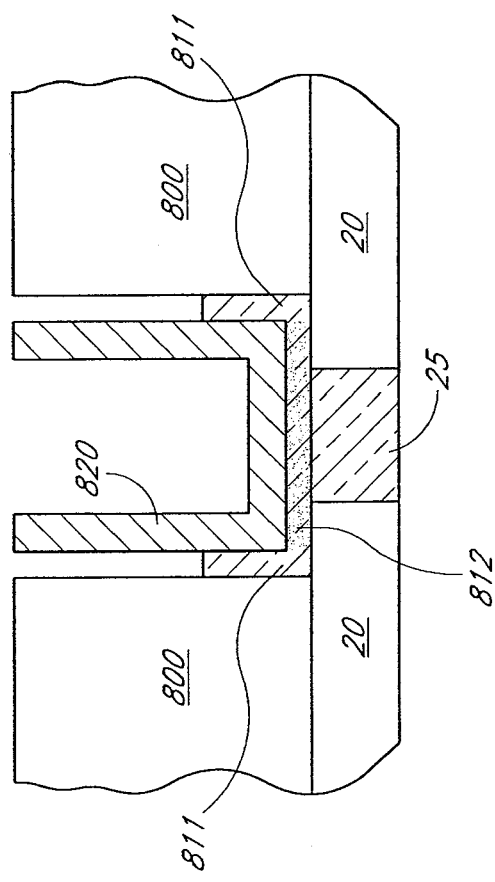
Figure 8E:
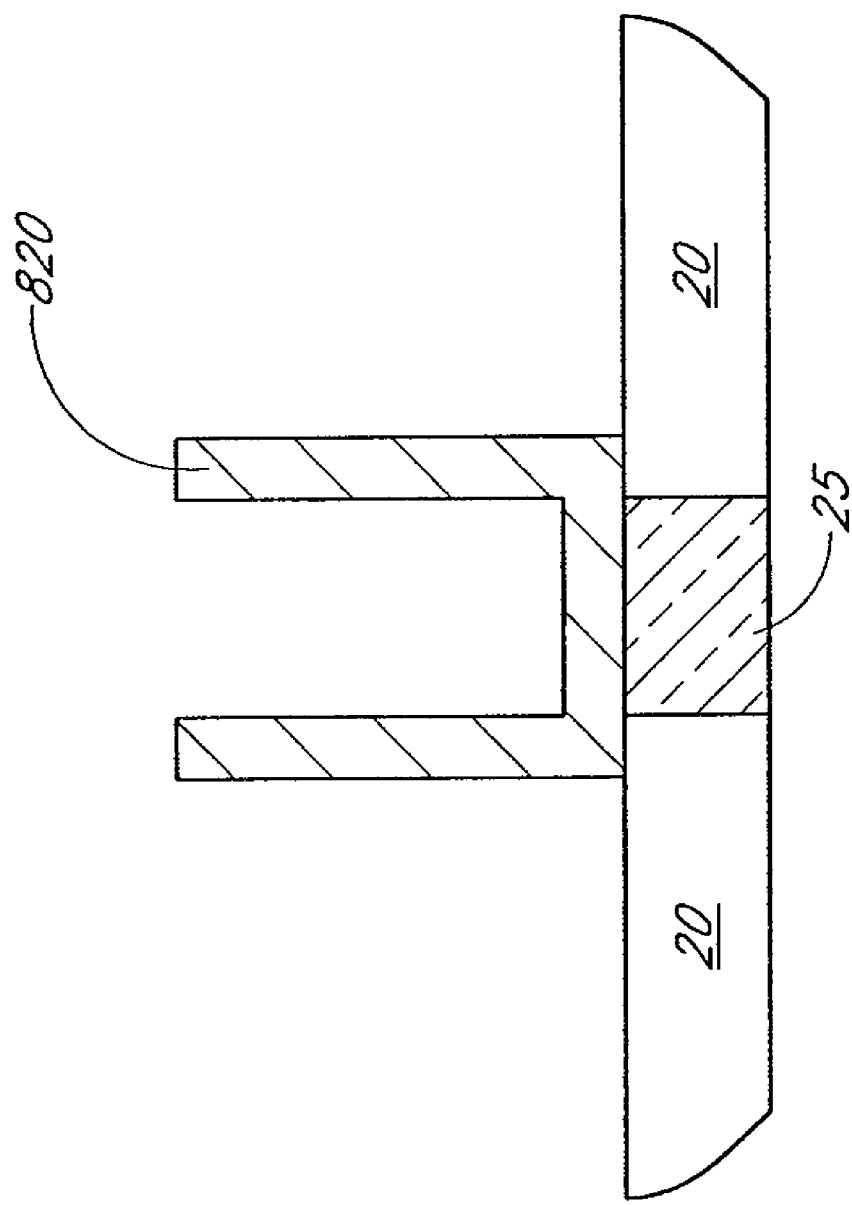

FIG. 8A illustrates a polysilicon sacrificial layer 810 and a metal lower electrode 820 formed within a recess in a structural layer 800. FIG. 8B illustrates the alteration of the polysilicon layer into two distinct layers. The base of the polysilicon layer 812 and the sacrificial layer 811 have been implanted to change the electron band gap of the polysilicon to form a highly etchable layer, while the lower vertical layer 811 is substantially unimplanted. FIG. 8C illustrates the structure after the highly etchable upper layer 812 has been removed, leaving the lower poly layer 811. FIG. 8D shows the structure after the structural layer 800 has been removed. The metallic lower electrode can then be used to form a double-sided container capacitor as described above.

Intermediate and Final Structure

In a preferred embodiment shown in FIGS. 2A-2D, the isolated lower electrode 120 is formed using a highly doped PSG sacrificial layer 110 and a protective layer 112. In the embodiment illustrated in FIGS. 3A-3D, the isolated lower electrode 320 is formed using a germanium oxide sacrificial layer 310 and a protective layer 315. In the embodiment illustrated in FIGS. 4A-3D, the isolated lower electrode 420 is formed using a doped oxide sacrificial layer 310. Lower electrode materials in these embodiments include poly, TiN, metals, and metal alloys. These processes offer excellent selectivity between the sacrificial material and the lower electrode materials. Electrodes formed using these processes will not be substantially etched during the removal of the sacrificial layer. Additionally, substantially all of the sacrificial material and the structural layer material in the array will be removed.

These isolated lower electrodes will be ideally suited to the formation of a compact memory array. Preferred materials for the lower electrodes are polysilicon, TiN, metals, and metal alloys. Referring now to FIG. 4D, preferably, the lower electrodes are formed contacting a poly plug 25 within an ILD layer 20. As illustrated, the lower electrode is preferably formed with an array of similarly formed lower electrodes.

Referring now to FIG. 1I, the fully-formed capacitor is preferably in an array for use as memory cell capacitors in DRAM. Preferably the lower electrode 40 comprises polysilicon, TiN, a metal, or a metal alloy. The lower electrode 40 is preferably in direct contact with the plug 25. A conformal capacitor dielectric 50 extends over the lower electrode 40. The upper electrode 60 extends over the conformal capacitor dielectric. Optionally, the capacitor is covered with a layer of an insulator, which is not pictured, over the completed capacitors prior to upper metallization layers.

The dimensions of the capacitor can relate to the performance of the DRAM memory cell array. With reference to FIG. 1I, the height of the capacitor from the highest point 23 to base of the interior of the container 21 is preferably between about 800 nm and 3000 nm, more preferably between 1250 nm and 2500 nm. The diameter at the widest point of the container capacitor is between about 100 nm and 450 nm, more preferably about 175 nm and 375 nm. The distance 22 between two capacitors in the memory cell array is preferably between about 50 nm and 160 nm, more preferably between about 60 nm and 150 nm.

In a preferred embodiment illustrated in FIGS. 5A-5D, the isolated lower electrode is formed using a metal nitride or metal oxide sacrificial layer 510 and a protective layer 515. Preferred lower electrode 520 materials include TiN and poly. The protective layer prevents the diffusion of metal from the sacrificial material 510 into the lower electrode material 520. The reduced diffusion into the electrode 520 allows higher selectivity to the electrode material during the sacrificial etch, creating a more stable and un-etched lower electrode 520.

In a preferred embodiment illustrated in FIGS. 6A-6G, the isolated lower electrode 620 is formed using a polysilicon sacrificial layer 610 (FIG. 6D). Preferred lower electrode materials include TiN, metals, such as tungsten, ruthenium, and platinum, and metal alloys. The sacrificial polysilicon 610 is doped in one section using a highly doped oxide collar 603 within the structural layer in order to form an etch stop layer 611. The resulting lower electrode 620 may have a polysilicon stub 610 remaining from the sacrificial layer. Additionally, the lower portion of the structural layer 601 may not be removed within the memory array.

In a preferred embodiment illustrated in FIGS. 7A-7E, the isolated lower electrode 720 is formed using a polysilicon sacrificial layer 710. Preferred lower electrode materials 720 include TiN, metals, such as tungsten, ruthenium, and platinum, and metal alloys. The sacrificial polysilicon 710 is doped in one section using a metallic collar 703 within the structural layer 700 in order to form an etch stop layer 711. The metal from the metallic collar 703 diffuses into a portion of the sacrificial layer that becomes an etch stop layer 711. The resulting lower electrode 720 may have a polysilicon stub 710 remaining from the sacrificial layer, as seen in FIG. 7D. Additionally, the lower portion of the structural layer 701 and the metallic collar 703 may not be removed within the memory array. The metallic collar is electrically isolated by the insulating capacitor dielectric 730.

These capacitors are preferably used in an array. For example, FIG. 7D depicts two capacitors of the array. Once the upper electrode (not pictured) is formed and the capacitors are completed, subsequent processing will complete the formation of DRAM cells from the capacitors in the array. In the illustrated embodiment of FIG. 7D, a portion of the metallic collar layer and the insulating layer 701 are left in the array between capacitors after isolation by the capacitor dielectric 730.

In a preferred embodiment illustrated in FIGS. 8A-8D, the lower electrode 820 is again formed using a polysilicon sacrificial layer 810. In a preferred embodiment, a bottom portion 812 of the polysilicon sacrificial layer 810 remains situated between the lower electrode 820 and the plug 25. Additionally, a lower portion 811, which serves as an etch stop layer, of the sidewalls of the sacrificial layer preferably remains in contact with the lower electrode 820. The lower electrode can be used to form a capacitor by depositing a conformal capacitor dielectric and an upper electrode.

It will be appreciated by those skilled in the art that various omissions, additions and modifications may be made to the methods and structures described above without departing from the scope of the invention. All such modifications and changes are intended to fall within the scope of the invention, as defined by the appended claims.

We claim:

1. A capacitor array for an integrated circuit comprising:
   a plurality of conductive contact plugs within an underlayer dielectric layer;
   a plurality of container-shaped lower electrodes over each conductive plug;
   an insulating layer between the lower electrodes;
   an electrically unconnected metallic layer between the lower electrodes over a portion of the insulating layer, wherein the electrically unconnected metallic layer does not electrically contact the lower electrodes;
   a conformal capacitor dielectric extending over the lower electrodes, wherein the capacitor dielectric isolates the metallic layer; and
   an upper electrode extending conformally over the conformal capacitor dielectric.

2. The capacitor array of claim 1, wherein the conductive plugs comprise polysilicon plugs.

3. The capacitor array of claim 1, wherein the lower electrodes comprise a material selected from a group consisting of titanium nitride, tungsten, platinum, and ruthenium.

4. The capacitor array of claim 3, wherein the lower electrodes comprise tungsten.

5. The capacitor array of claim 3, wherein the lower electrodes Comprise titanium nitride.

6. The capacitor array of claim 1, wherein the insulating layer comprises a silicon oxide layer.

7. The capacitor array of claim 6, wherein the insulating layer comprises a borophosphosilicate glass (BPSG) layer.

8. The capacitor array of claim 1, wherein the metallic layer comprises a material selected from a group consisting of tungsten, titanium oxide, and aluminum oxide.

9. The capacitor array of claim 1, wherein the metallic layer is positioned between 10 Å and 1500 Å above the underlayer dielectric layer.

10. The capacitor array of claim 9, wherein the metallic layer is positioned between 20 Å and 750 Å above the underlayer dielectric layer.

11. The capacitor array of claim 1, wherein the conformal capacitor dielectric comprises a material selected from the group consisting of tantalum oxide, hafnium oxide, and zirconium oxide.

12. An integrated circuit including a capacitor comprising:
   a conductive contact plug within an underlayer;
   a container-shaped lower electrode over and electrically connected to the conductive contact plug, the lower electrode including a substantially vertical surface;
   a polysilicon stub horizontally adjacent to and contacting a portion of the substantially vertical surface of the lower electrode;
   a conformal capacitor dielectric extending over the lower electrode and the polysilicon stub; and
   an upper electrode extending con formally over the conformal capacitor dielectric;
   wherein the container-shaped lower electrode comprises a metallic lower electrode.

13. The integrated circuit of claim 12, wherein the conductive contact plug comprises a polysilicon plug.

14. The integrated circuit of claim 12, further comprising a polysilicon layer implanted with ions between the conductive contact plug and the lower electrode.

15. The integrated circuit of claim 14, wherein the polysilicon layer implanted with ions comprises a polysilicon layer implanted with a plurality of boron ions.

16. The integrated circuit of claim 14, wherein the polysilicon layer implanted with ions comprises a polysilicon layer implanted with a plurality of phosphorus ions.

17. The integrated circuit of claim 12, wherein the container shaped lower electrode comprises a titanium nitride lower electrode.

* * * * *

UNITED STATES PATENT AND TRADEMARK OFFICE
CERTIFICATE OF CORRECTION

PATENT NO. : 7,667,258 B2  Page 1 of 1
APPLICATION NO. : 11/625130
DATED : February 23, 2010
INVENTOR(S) : Gurtej S. Sandhu et al.

It is certified that error appears in the above-identified patent and that said Letters Patent is hereby corrected as shown below:

In column 18, line 11, in Claim 5, delete "Comprise" and insert -- comprise --, therefor.

In column 18, line 39, in Claim 12, delete "con formally" and insert -- conformally --, therefor.

Signed and Sealed this

Eighteenth Day of May, 2010

David J. Kappos
*Director of the United States Patent and Trademark Office*